(12) United States Patent
Nikoobakht et al.

(10) Patent No.: US 11,271,137 B2
(45) Date of Patent: Mar. 8, 2022

(54) LIGHT ARTICLE

(71) Applicant: Government of the United States of America, as represented by the Secretary of Commerce, Gaithersburg, MD (US)

(72) Inventors: Babak Nikoobakht, Potomac, MD (US); Robin Paul Hansen, Rockville, MD (US)

(73) Assignee: GOVERNMENT OF THE UNITED STATES OF AMERICA, AS REPRESENTED BY THE SECRETARY OF COMMERCE, Gaithersburg, MD (US)

( * ) Notice: Subject to any disclaimer, the term of this patent is extended or adjusted under 35 U.S.C. 154(b) by 49 days.

(21) Appl. No.: 16/804,203

(22) Filed: Feb. 28, 2020

(65) Prior Publication Data

US 2021/0119081 A1 Apr. 22, 2021

Related U.S. Application Data

(60) Provisional application No. 62/916,978, filed on Oct. 18, 2019.

(51) Int. Cl.
| | |
|---|---|
| *H01L 33/24* | (2010.01) |
| *H01L 33/32* | (2010.01) |
| *H01L 33/00* | (2010.01) |
| *H01L 33/06* | (2010.01) |
| *B82Y 20/00* | (2011.01) |

(52) U.S. Cl.
CPC ............ *H01L 33/24* (2013.01); *H01L 33/007* (2013.01); *H01L 33/06* (2013.01); *H01L 33/325* (2013.01); *B82Y 20/00* (2013.01)

(58) Field of Classification Search
CPC combination set(s) only.
See application file for complete search history.

(56) References Cited

U.S. PATENT DOCUMENTS

2017/0263834 A1* 9/2017 Yamaguchi ............. H01L 33/62
2017/0359865 A1* 12/2017 Kim ........................ H05B 33/04

OTHER PUBLICATIONS

Nikoobakht, B., et al., "Formation of Planar Arrays of One-Dimensional p-n Heterojunctions Using Surface-Directed Growth of Nnowires and Nanowalls", ACS Nano, 2010, p. 5877-5886, vol. 4 No 10.

* cited by examiner

*Primary Examiner* — Moin M Rahman
(74) *Attorney, Agent, or Firm* — Office of Chief Counsel for National Institute of Standards and Technology

(57) ABSTRACT

A light article includes: a substrate; a truncated cuboidal fin disposed on the substrate and including: a laterally-grown nanocrystal including a longitudinal length and a lateral length that are different; a charge injection facet arranged along a longitudinal fin axis of the truncated cuboidal fin; and a truncation facet disposed opposing the charge injection facet and arranged parallel to the longitudinal fin axis; a side-injector disposed on the charge injection facet of the truncated cuboidal fin and that provides electrons to an active layer; and the active layer interposed between the side-injector and the substrate and that: receives electrons from the side-injector; receives holes from the substrate; and produces light in response to combining the electrons and the holes.

18 Claims, 25 Drawing Sheets

LIGHT ARTICLE

CROSS REFERENCE TO RELATED APPLICATIONS

The application claims priority to U.S. Provisional Patent Application Ser. No. 62/916,978 filed Oct. 18, 2019, the disclosure of which is incorporated herein by reference in its entirety.

STATEMENT REGARDING FEDERALLY SPONSORED RESEARCH

This invention was made with United States Government support from the National Institute of Standards and Technology (NIST), an agency of the United States Department of Commerce. The Government has certain rights in the invention. Licensing inquiries may be directed to the Technology Partnerships Office, NIST, Gaithersburg, Md., 20899; voice (301) 301-975-2573; email tpo@nist.gov; reference NIST Docket Number 19-007US1.

BRIEF DESCRIPTION

Disclosed is a light article comprising: a substrate; a truncated cuboidal fin disposed on the substrate and comprising: a laterally-grown nanocrystal comprising a longitudinal length and a lateral length that are different; a charge injection facet arranged along a longitudinal fin axis of the truncated cuboidal fin; and a truncation facet disposed opposing the charge injection facet and arranged parallel to the longitudinal fin axis; a side-injector disposed on the charge injection facet of the truncated cuboidal fin and that provides electrons to an active layer; and the active layer interposed between the side-injector and the substrate and that: receives electrons from the side-injector; receives holes from the substrate; and produces light in response to combining the electrons and the holes.

Disclosed is a process for making a light article, the process comprising: forming a catalyst pattern on a substrate, the catalyst pattern comprising a catalyst; forming a mask on a masked portion of the catalyst pattern while providing an exposed portion of the catalyst pattern in an absence of the mask on the exposed portion of the catalyst pattern; controllably quenching growth of nanostructures from the masked portion of the catalyst pattern by the mask disposed on the masked portion of the catalyst pattern; propagating the catalyst from the exposed portion of the catalyst pattern along a single crystal index of the substrate; forming a truncated cuboidal fin selectively along the single crystal index of the substrate in the presence of the catalyst as the catalyst propagates along the single crystal index of the substrate, such that the truncated cuboidal fin comprises: a laterally-grown nanocrystal comprising a longitudinal length and a lateral length that are different; a charge injection facet arranged along a longitudinal fin axis of the truncated cuboidal fin, the longitudinal fin axis being disposed along the single crystal index; and a truncation facet disposed opposing the charge injection facet and arranged parallel to the longitudinal fin axis, such that in forming the truncated cuboidal fin a translation order and orientation order of the laterally-grown nanocrystal is controlled by a crystal symmetry of the substrate; subjecting the truncated cuboidal fin to angular-directed passivation in which the truncation facet is contacted by a passivation composition, and the charge injection facet is not contacted by the passivation composition; forming, from the passivation composition, a passivation layer on the truncation facet in response to subjecting the truncated cuboidal fin to angular-directed passivation; subjecting the truncated cuboidal fin to angular-directed deposition in which the charge injection facet is contacted by a deposition composition, and the truncation facet is not contacted by the deposition composition; and forming, from the deposition composition, a side-injector on the charge injection facet in response to subjecting the truncated cuboidal fin to angular-directed deposition to form the light article.

Disclosed is a process for producing light with a light article, the process comprising: providing electrons to side-injector, side-injector disposed on charge injection facet opposing truncation facet of truncated cuboidal fin; communicating electrons from side-injector to active layer; providing holes to substrate; communicating holes from substrate to active layer; receiving, by active layer, electrons from side-injector and holes from substrate; combining, in active layer, electrons and holes; and producing light from combining electrons and holes in active layer.

BRIEF DESCRIPTION OF THE DRAWINGS

The following description should not be considered limiting in any way. With reference to the accompanying drawings, like elements are numbered alike.

DETAILED DESCRIPTION

Figure 1:
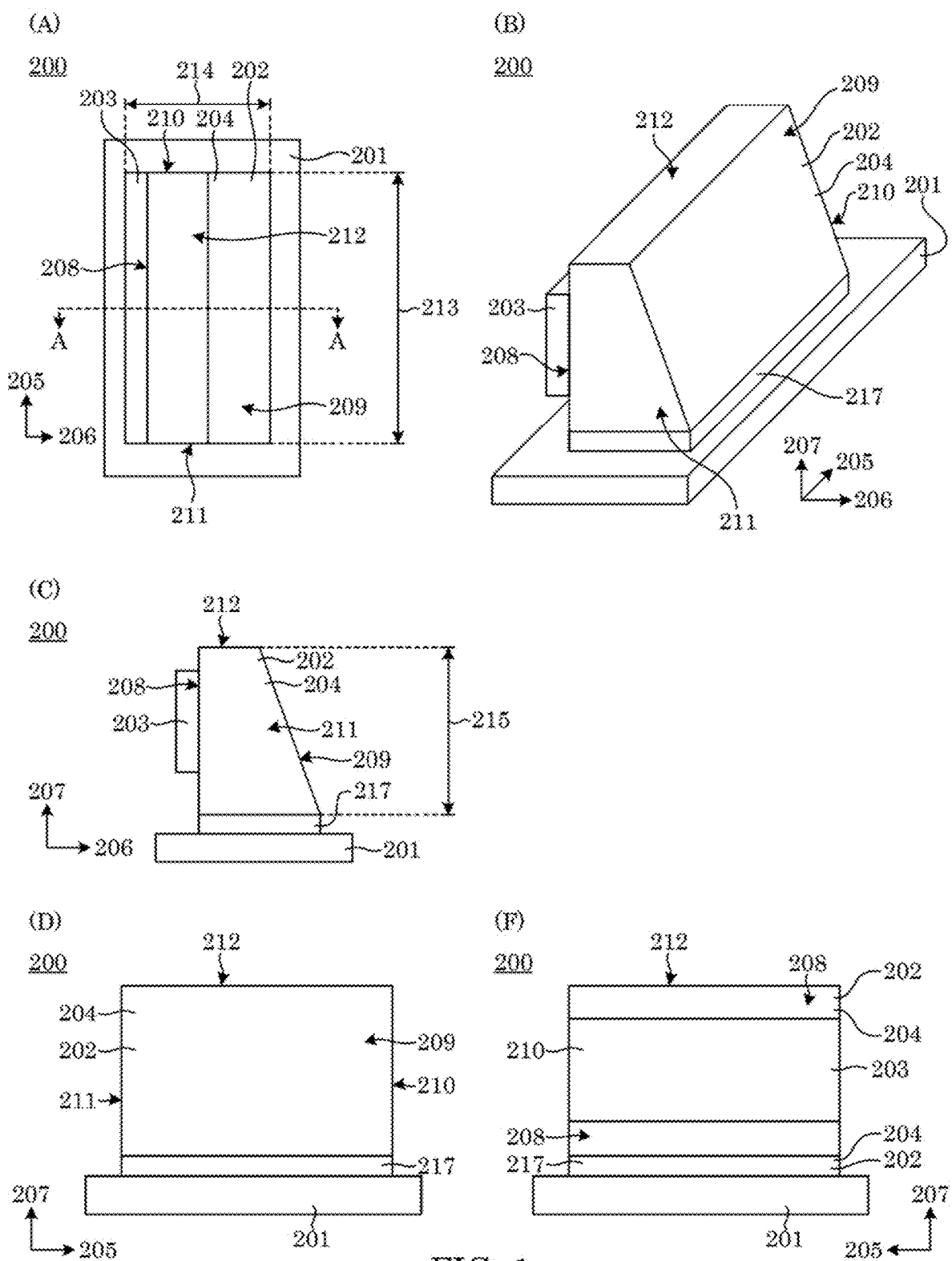
FIG. 1 shows a plan view of a light article in panel A, a perspective view of the light article in panel B, a cross-section along line A-A in panel C of the light article shown in panel A, a side view along a lateral fin axis of a truncation facet of the light article in panel D, and a side view of a side-injector disposed on a charge injection facet of the light article in panel E.

A detailed description of one or more embodiments is presented herein by way of exemplification and not limitation.

It has been discovered that a light article herein can include uniformly charged nanocrystals so that large area interfaces per nanocrystal can be formed for electrically powering or operating such nanocrystals with metal-interfaces, including metal-semiconductor and semiconductor-semiconductor. The light article is structurally uniform to provide nanodevices such a nano light emitting diode (nanoLED) in which, in an array of such light articles, the light articles have identical electro-optical properties on very large areas. Advantageously, the light article is made by facet-selective passivation of nanocrystals to provide facet-selective charge injection. As a result, high-performance nanoscale light emitting diodes, lasers, and transistors can be fabricated that provide a broad range of applications from deep-ultraviolet laser sources to detectors for trace detection of chemicals.

Making the light article can occur by forming individual nanowires in-plane of a surface a substrate with controlled orientation and location, and the resulting light article can be electrically powered. With light articles selectively arranged on a substrate, a uniformly luminous interface can be formed in which the light article have similar electro-optical properties. Beneficially, embodiments include selectively choosing a nanocrystal facet for metallization or overgrowth with another semiconductor thereon. Moreover, articles and processes herein overcome conventional technological limits of scale production of second generation or third generation semiconductor (non-silicon based) devices.

In an embodiment with reference to FIG. 1, FIG. 2, FIG. 3, and FIG. 4, light article 200 includes substrate 201; truncated cuboidal fin 202 disposed on substrate 201 and including: laterally-grown nanocrystal 204 that includes longitudinal length 213 and lateral length 214 that are different; charge injection facet 208 arranged along longitudinal fin axis 205 of truncated cuboidal fin 202; and truncation facet 209 disposed opposing charge injection facet 208 and arranged parallel to longitudinal fin axis 205; side-injector 203 disposed on charge injection facet 208 of truncated cuboidal fin 202 and that provides electrons 222 to active layer 217; and active layer 217 interposed between side-injector 203 and substrate 201 and that: receives electrons 222 from side-injector 203; receives holes 223 from substrate 201; and produces light 221 in response to combining electrons 222 and holes 223. Truncated cuboidal fin 202 includes initiation facet 211 disposed along lateral fin axis 206 of truncated cuboidal fin 202 and from which charge injection facet 208 and truncation facet 209 propagate during growth. Truncated cuboidal fin 202 further includes terminal facet 210 disposed parallel to lateral fin axis 206 of truncated cuboidal fin 202 and at which charge injection facet 208 and truncation facet 209 terminate along longitudinal fin axis 205 during growth. Truncated cuboidal fin 202 also includes top facet 212 disposed parallel to longitudinal fin axis 205 of truncated cuboidal fin 202 and at which charge injection facet 208 and truncation facet 209 terminate along height fin axis 207 of truncated cuboidal fin 202 during growth.

Figure 2:
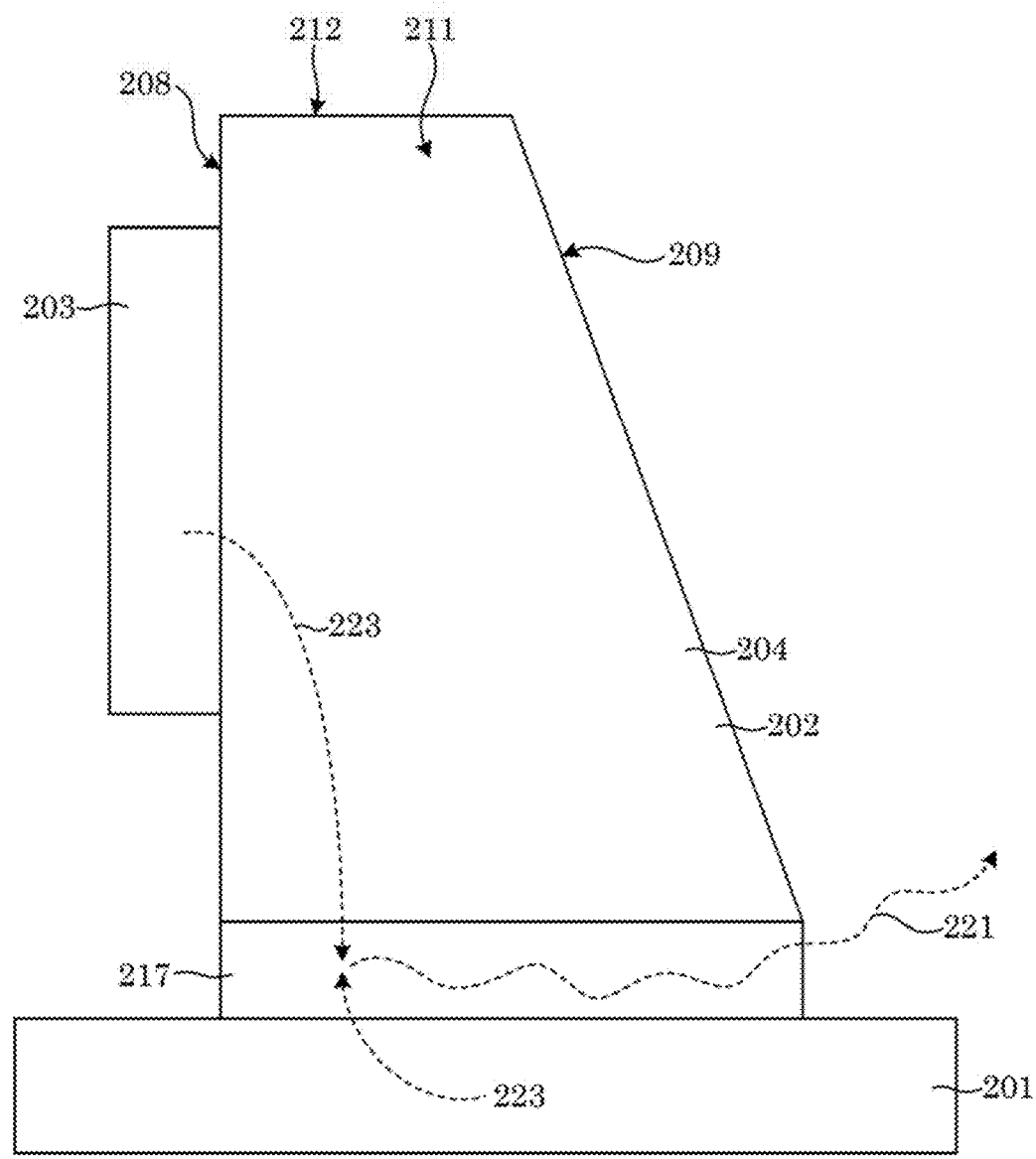
FIG. 2 shows electrons from the side-injector combining with holes from the substrate in the active layer to produce light by the light article shown in FIG. 1.
Figure 3:
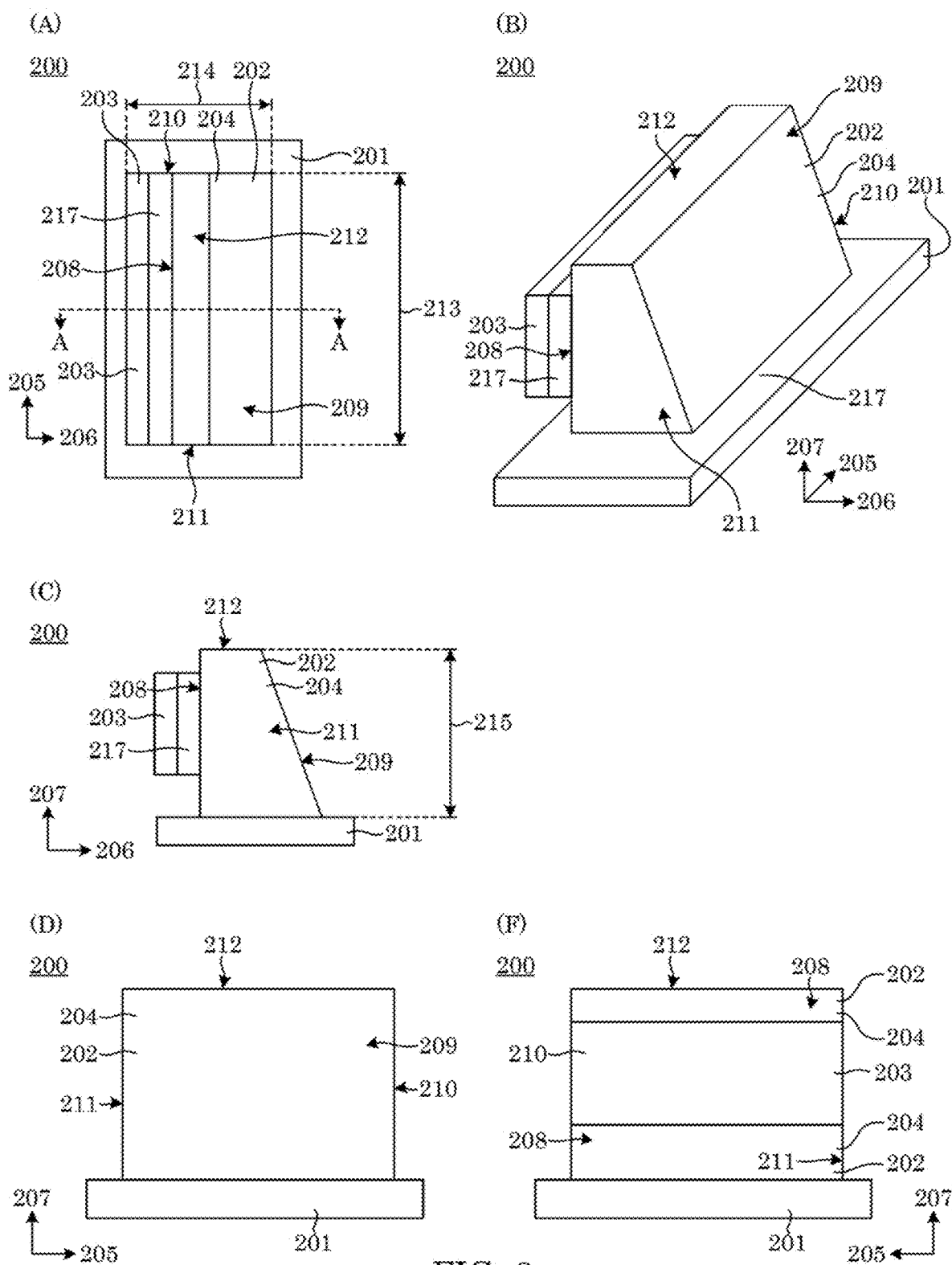
FIG. 3 shows a plan view of a light article in panel A, a perspective view of the light article in panel B, a cross-section along line A-A in panel C of the light article shown in panel A, a side view along a lateral fin axis of a truncation facet of the light article in panel D, and a side view of a side-injector disposed on a charge injection facet of the light article in panel E.
Figure 4:
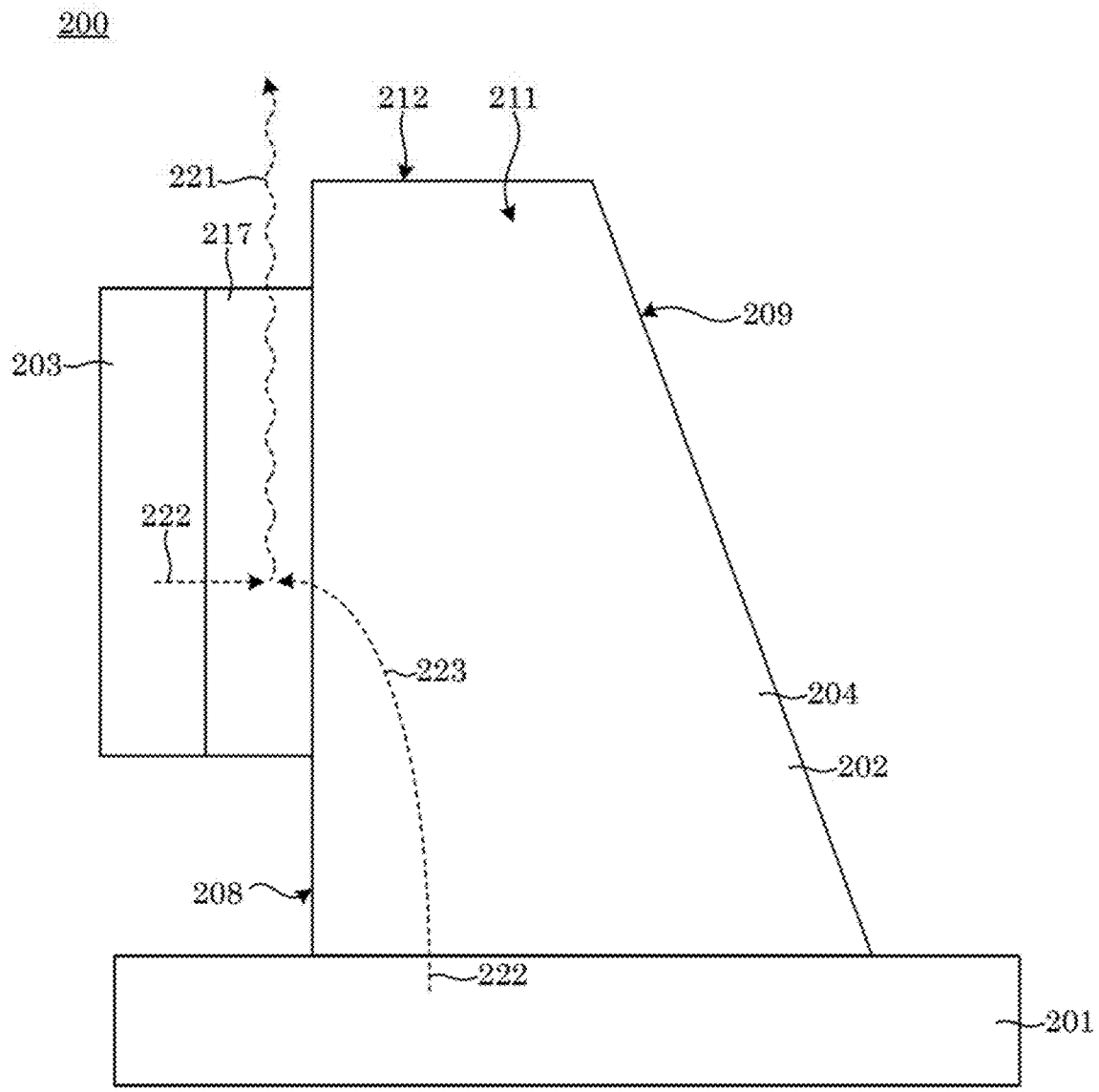
FIG. 4 shows electrons from the side-injector combining with holes from the substrate in the active layer to produce light by the light article shown in FIG. 3.

According to an embodiment, as shown in FIG. 2, active layer 217 is interposed between truncated cuboidal fin 202 and substrate 201. In some embodiments, as shown in FIG. 4, active layer 217 is interposed between truncated cuboidal fin 202 and side-injector 203.

Figure 5:
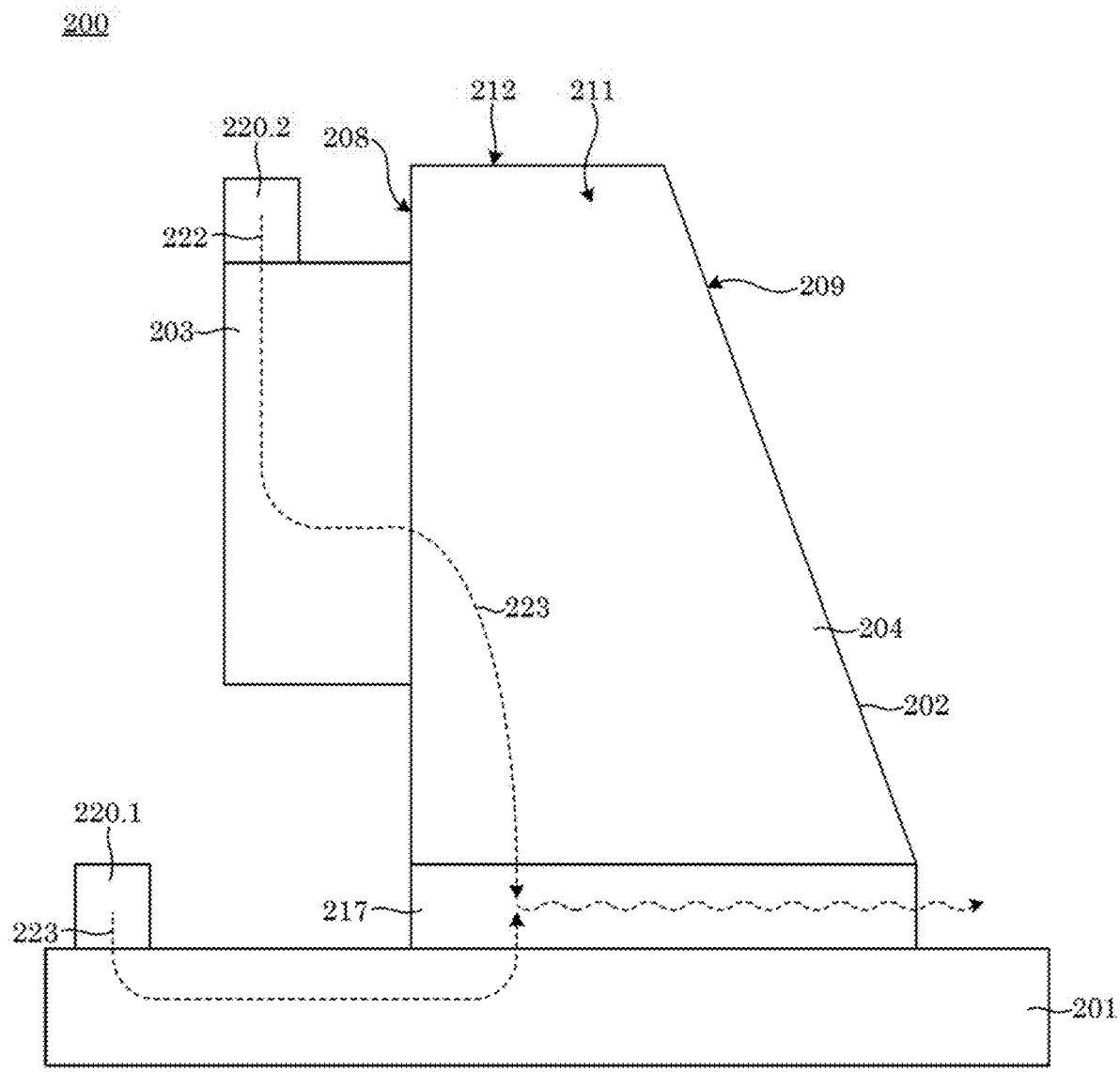
FIG. 5 shows an electrical via disposed on the side-injector and an electrical via disposed on the substrate of the light article shown in FIG. 1.
Figure 6:
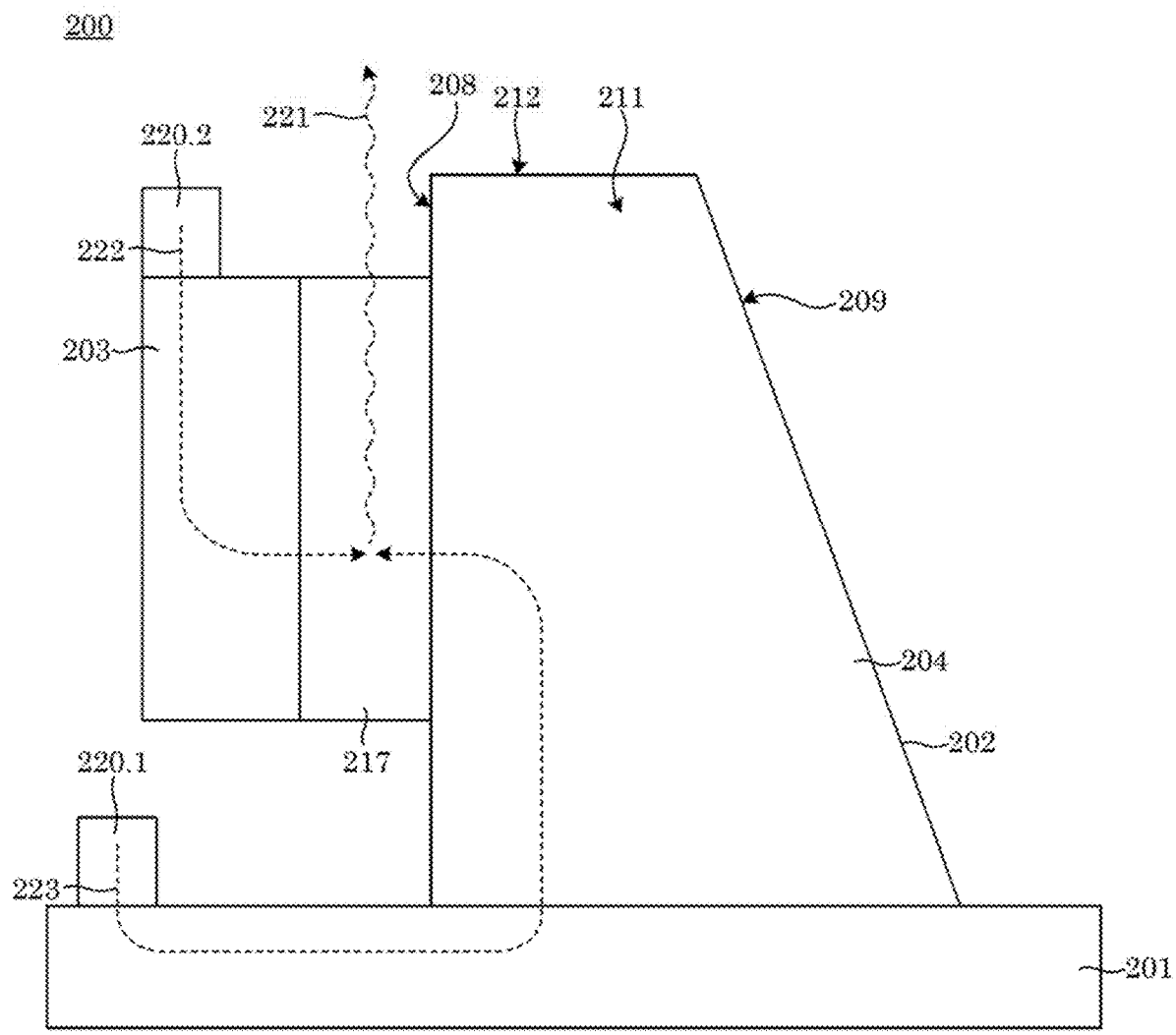
FIG. 6 shows an electrical via disposed on the side-injector and an electrical via disposed on the substrate of the light article shown in FIG. 3.

In an embodiment, with reference to FIG. 5 and FIG. 6, light article 200 includes electrical via 220 disposed on side-injector 203 and electrical via 220 disposed on substrate 201.

Figure 7:
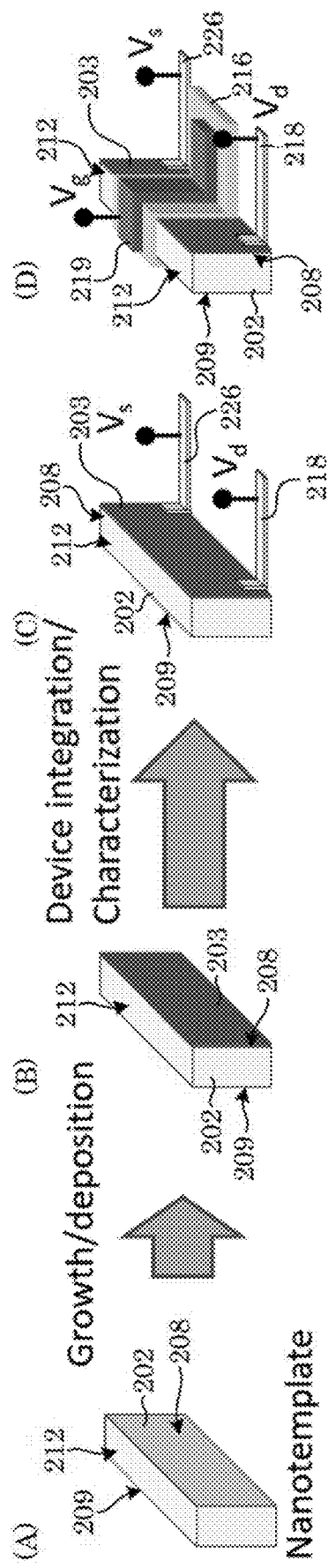
FIG. 7 shows formation of a light article that includes a side-injection drain electrode, side-injection source electrode, dielectric member, and gate electrode.

In an embodiment, with reference to FIG. 7, light article 200 includes side-injection drain electrode 218 disposed on side-injector 203; side-injection source electrode 226 disposed on side-injector 203 and in electrical communication with side-injection drain electrode 218 through side-injector 203; dielectric member 216 disposed on side-injector 203 between side-injection drain electrode 218 and side-injection source electrode 226; and gate electrode 219 disposed on dielectric member 216. In this manner gate electrode 219 is in electrical communication with side-injection drain electrode 218 and side-injection source electrode 226 through dielectric member 216. Dielectric member 216 is interposed between gate electrode 219 and side-injector 203, wherein side-injector 203 includes a semiconducting material.

Light article 200 includes substrate 201 and structurally supports various components of light article 200 such as truncated cuboidal fin 202. Exemplary substrata 201 include a material that can communicate electrons or electron holes such as a semiconductor (e.g., a third generation semiconductor such as gallium nitride (GaN), silicon carbide (SiC), aluminum nitride (AlN), gallium nitride (GaN), diamond, or zinc oxide (ZnO)), a material that is electrically insulating (e.g., glass, ceramic, polymer, and the like), and the like. Moreover, substrate 201 can include a p- or n-doped semiconductor layer with dopant concentration, e.g., of $5 \times 10^{17}$ cm$^{-3}$ or stack of quantum wells (QWs) including one to several QWs. A thickness of substrate 201 can be from 10 nm to 3000 nm, specifically from 200 nm to 700 nm, and more specifically 700 nm. This layer could be grown over an undoped semiconductor as a supporting substrate that can be 500 nm to 2000 nm. The undoped supporting layer can be grown on even a thicker substrate such as sapphire or silicon wafer with a thickness range of 100 μm to 500 μm. Longitudinal length 213 of truncated cuboidal fin 202 along longitudinal fin axis 205 can be from 100 nm to 100 μm, specifically from 3 μm to 40 μm, and more specifically about 5 μm. Lateral length 214 of truncated cuboidal fin 202 along lateral fin axis 206 can be from 50 nm to 1000 nm, specifically from 160 nm to 220 nm. Height length 215 of truncated cuboidal fin 202 along height fin axis 207 can be from 50 nm to 4000 nm, specifically from 1000 nm to 2000 nm, and more specifically from 1100 nm to 1200 nm. It is contemplated that substrate 201 can include a semiconductor and a dopant. Such dopants provide electron and hole densities to form abrupt interfaces for electron-hole recombination and light emission. Alternatively, the same junction could be used for charge separation and light detection. Exemplary dopants include silicon and germanium for n-type doping, and magnesium for p-type doping. According to an embodiment, substrate 201 includes 700 nm thick p-doped GaN on 1300 nm thick undoped GaN.

Figure 9:
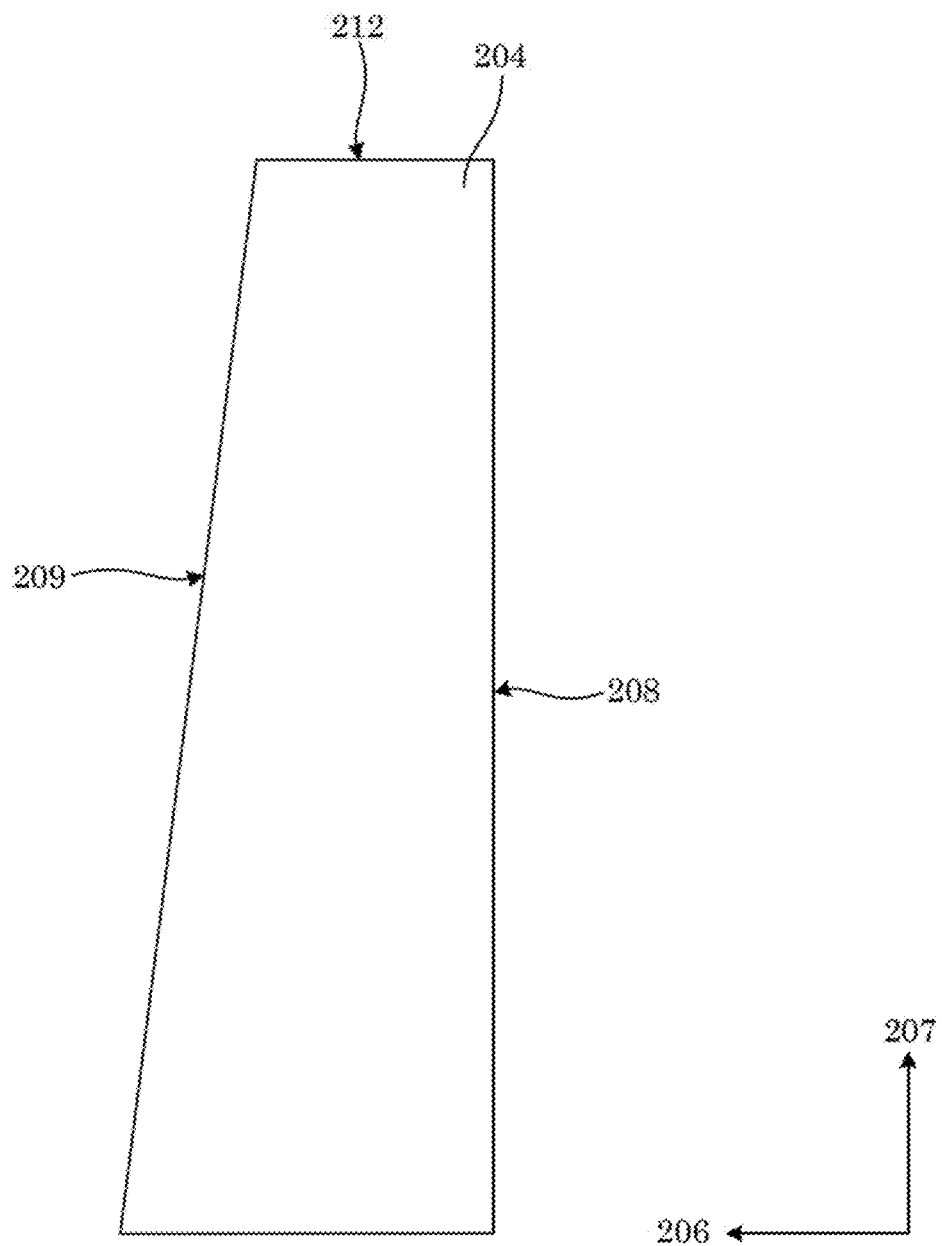
FIG. 9 shows a truncated cuboidal fin.
Figure 10:
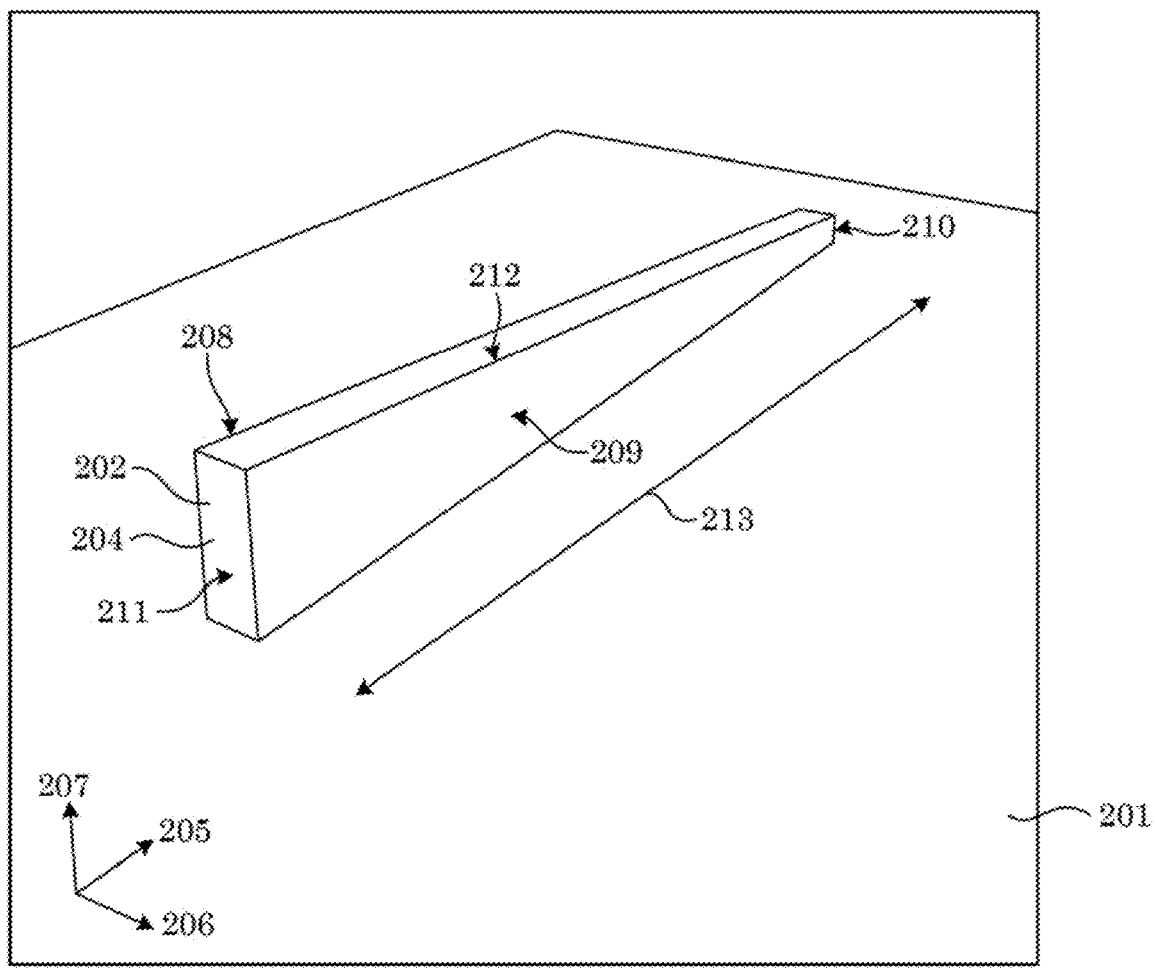
FIG. 10 shows a light article disposed on a substrate.

Truncated cuboidal fin 202 is formed on substrate 201 to form a p-n junction. Exemplary truncated cuboidal fins 202 include a semiconductor such as a third-generation semiconductor, e.g., gallium nitride or zinc oxide. The dopant concentration of truncated cuboidal fin 202 can be from undoped ($<1\times10^{11}$ cm$^{-3}$) to highly doped ($>5\times10^{18}$ cm$^{-3}$). It should be appreciated that a transverse cross-sectional shape in a plane parallel to height fin axis 207 and lateral fin axis 206 (e.g., as shown in panel C of FIG. 1 and in FIG. 9) of truncated cuboidal fin 202 is determined by growth of laterally-grown nanocrystal 204 on substrate 201 and approximates a right trapezoid Growth of truncated cuboidal fin 202 starts at initiation facet 211 in a presence of catalyst 227, and growth of truncated cuboidal fin 202 propagates along longitudinal fin axis 205 on substrate 201. Growth of truncated cuboidal fin 202 longitudinally terminates at terminal facet 210. Accordingly, with reference to FIG. 10, truncated cuboidal fin 202 includes charge injection facet 208 that can be substantially normal to the surface of substrate 201 on which truncated cuboidal fin 202 forms, substantially normal to lateral fin axis 206, and substantially parallel to height fin axis 207. Truncation facet 209 is at an oblique angle to lateral fin axis 206 and canted toward charge injection facet 208 in a direction of height fin axis 207.

Laterally-grown nanocrystal 204 can include a gallium nitride single crystal. Since laterally-grown nanocrystal 204 selectively grows along a crystalline direction on substrate 201, longitudinal fin axis 205 of truncated cuboidal fin 202 is disposed along a selected crystal index of substrate 201. Exemplary crystal indexes of substrate 201 along which laterally-grown nanocrystal 204 grows such that longitudinal fin axis 205 is directed along such index include [−1010], [−1100], [01−10], and the like as shown, e.g., in FIG. 13.

It is contemplated that laterally-grown nanocrystal 204 can include a semiconductor and a dopant. Such dopants provide a p-n junction interface for recombination of electrons and holes to generate or detect light. Exemplary dopants include K, Mg, Li, and the like. According to an embodiment, laterally-grown nanocrystal 204 includes n-doped II-VI and III-V semiconductors such as ZnO, AlN, GaN, CdS and the like.

Side-injector 203 is formed on charge injection facet 208 of truncated cuboidal fin 202. Side-injector 203 injects charges, e.g., electrons 222, into truncation facet 209 as shown in FIG. 2 or into active layer 217 as shown in FIG. 4. It is contemplated that, instead of electrons 222, side-injector 203 can inject holes 223 into truncated cuboidal fin 202 or active layer 217. Whether side-injector 203 injects electrons 222 or holes 223 can depend upon doping of side-injector 203 relative to other components of light article 200. In this respect, side-injector 203 injects electrons 222 when side-injector 203 is n-doped and injects holes 223 when p-doped. Side-injector 203 can include an electrical conductor or an electrical semiconductor in which the dopant is disposed.

P-dopants include materials that support transport of holes 223 such as phenylamines, triphenyl-amines, fluorenes, benzidines, and the like. Examples of such p-dopants include: 4,4',4"-tris(N-3-methylphenyl-N-phenyl-amino) triphenylamine (m-MTDATA), 4,4',4"-tris(N-(2-naphthyl)-N-phenyl-amino)triphenylamine (2-TNATA), MeO-TPD (N,N,N',N'-tetrakis(4-methoxy-phenyl)benzidine), (2,2',7,7'-tetrakis-(N,N-diphenylamino)-9,9'-spirobifluoren (spiro-TTB), N,N'-bis(naphthalen-1-yl)-N,N'-bis(phenyl)-benzidine, N,N'-bis(naphthalen-1-yl)-N,N'-bis(phenyl)-9,9-spiro-bifluorene, 9,9-bis[4-(N,N-bis-biphenyl-4-yl-amino)phenyl]-9H-fluorine, N,N'-bis(phenanthren-9-yl)-N,N'-bis(phenyl)-benzidine, 2,2'-bis[N,N-bis(biphenyl-4-yl)amino] 9,9-spiro-bifluorene, 1,3,5-tris{4-[bis(9,9-dimethyl-fluorene-2-yl)amino]phenyl}benzene, tri(terphenyl-4-yl) amine, and N,N'-Bis(naphthalen-1-yl)-N,N'-bis(phenyl)-benzidine (NPD). The p-dopant can have a reduction potential from 0 V vs. a ferrocene/ferrocenium redox couple (referred to as Fc/Fc+) to 0.4 V vs. Fc/Fc+. Reduction potentials can be considered as measures for a LUMO of a molecule.

N-dopants include materials that support transport electrons 222 such as phosphorous, arsenic, antimony, alkali metals (e.g., Li, Cs, and the like), donor-type organic molecules that can provide increased electron conductivity in the doped material in comparison with a non-doped material, and the like.

Electrons 222 and holes 223 combine in active layer 217 to produce light 221. Active layer 217 can include a quantum well, a plurality of quantum dots, and the like. Exemplary quantum wells can include alternating layers of semiconductor material such as alternating layers of InGaN and GaN. Quantum dots can be disposed in a matrix that supports production of light 221 from combining electrons 222 and holes 223. Exemplary quantum dots include Group II-VI compound semiconductor nanocrystals such as CdS, CdSe, CdTe, ZnS, ZnSe, ZnTe, HgS, HgSe, and HgTe; Group III-V or IV-VI compound semiconductor nanocrystals such as GaP, GaAs, GaSb, InP, InAs, and InSb; PbS, PbSe, and PbTe; CuInSe2; metal oxide nanoparticles such as ZnO, TiO2; or a core-shell structured nanocrystal such as CdSe/ZnSe, CdSe/ZnS, CdS/ZnSe, CdS/ZnS, ZnSe/ZnS, InP/ZnS, and ZnO/MgO; and the like. The quantum dots can be semiconductor nanocrystals that are undoped or doped, e.g., with a rare earth element such as Eu, Er, Tb, Tm, or Dy, or doped with a transition metal element such as Mn, Cu, Ag; or a combination thereof. A thickness of catalyst 227 can be from 1 nm to 100 nm that is deposited on substrate 201 by a patterning method, e.g., optical lithography, or nano-imprinting.

Light 221 produced from active layer 217 can have a wavelength from deep UV to near infrared, specifically from deep UV to visible, and more specifically from 250 nm to 420 nm.

In an embodiment, side-injector 203 includes an electrical semiconductor with electrically conductive electrodes, side-injection source electrode 226, side-injection drain electrode 218, and gate electrode 219, are disposed on side-injector 203 in a field-effect transistor light emitting diode configuration. Side-injection source electrode 226, side-injection drain electrode 218, and gate electrode 219 independently can include aluminum, copper, titanium, tantalum, tungsten, molybdenum, chromium, neodymium, scandium, silver, titanium, or an alloy thereof; a conductive film such as indium tin oxide (ITO), indium zinc oxide (IZO), or the like; or a laminate thereof. Electrodes (218, 219, 226) independently can include a single layer structure or a stacked structure of layers. A thickness of electrodes (218, 219, 226) independently can be from 10 nm to 200 nm, specifically from 90 nm to 120 nm.

Dielectric member 216 is interposed between gate electrode 219 and side-injector 203 and is an insulator with a high relative dielectric constant. Dielectric member 216 can include gallium oxide, hafnium oxide, an oxide containing aluminum and hafnium, oxynitride containing aluminum and hafnium, an oxide containing silicon and hafnium, oxynitride containing silicon and hafnium, and the like. A thickness of dielectric member 216 can be from 2 nm to 200 nm, specifically from 20 nm to 30 nm.

To provide an electrical bias, electrical current, and the like to side-injector 203 and active layer 217, electrical via 220 can be included in light article 200. Electrical via 220 is electrically conductive and can include aluminum, copper, titanium, tantalum, tungsten, molybdenum, chromium, neodymium, scandium, silver, titanium, or an alloy thereof.

In making light article 200, several elements are involved. Catalyst 227 is disposed on substrate 201 in catalyst pattern 228 to form truncated cuboidal fin 202 and can include gold, copper, silver, and the like. Catalyst pattern 228 can be a selected size or shapes such as spherical or polygons. In an embodiment, catalyst 227 and catalyst pattern 228 respectively are gold and a patterned photoresist. Mask 229 can be disposed on a portion of catalyst 227 to eliminate growth of laterally-grown nanocrystal 204 on such portion. Mask 229 can be an inert material such as silicon oxide or chromium with a thickness range of 10 nm to 200 nm.

Passivation layer 224 is disposed on truncated cuboidal fin 202 to cover a selection portion of truncated cuboidal fin 202 to eliminate formation of side-injector 203 on such portion of truncated cuboidal fin 202. Passivation layer 224 can include an organic layer such as a photoresist or a dielectric material such as silicon oxide and the like.

Figure 11:
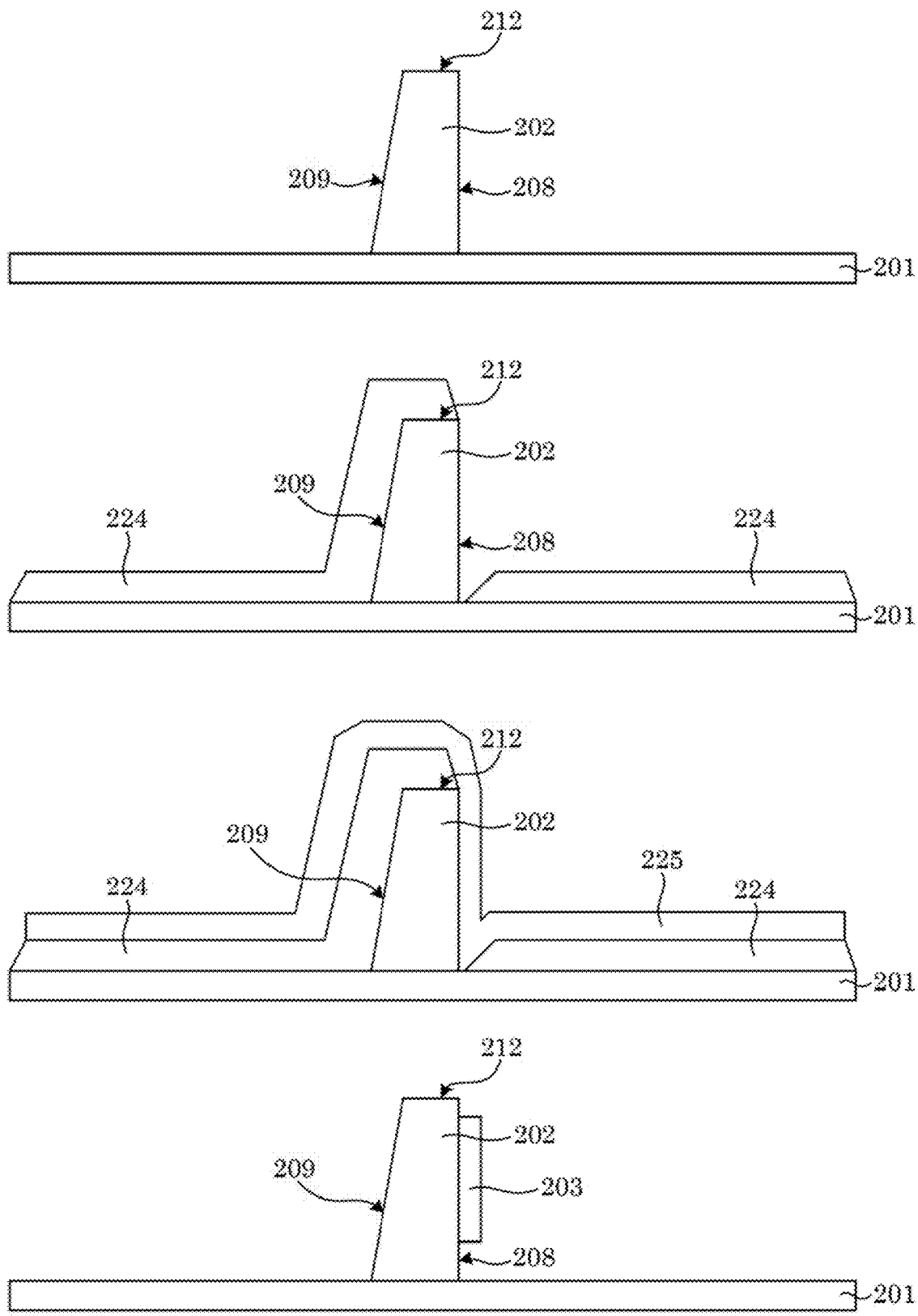
FIG. 11 shows formation of a light article.

Light article 200 can be made in various ways. In an embodiment, with reference to FIG. 11, a process for making light article 200 includes: forming catalyst pattern 228 on substrate 201, the catalyst pattern 228 including catalyst 227 by metal deposition on a patterned photoresist that contains pattern openings with the shape of rectangle or square; forming mask 229 on masked portion 230 of catalyst 227 while providing exposed portion 231 of catalyst pattern 228 in an absence of mask 229 on exposed portion 231 of catalyst pattern 228 by typical photolithography patterning methods; controllably quenching growth of nanostructures from masked portion 230 of the catalyst pattern 228 by mask 229 disposed on masked portion 230 of catalyst pattern 228; propagating catalyst 227 from exposed portion 231 of catalyst pattern 228 along a single crystal index of substrate 201 by lateral nanoepitaxy; forming truncated cuboidal fin 202 selectively along single crystal index 232 of substrate 201 in the presence of catalyst 227 as catalyst 227 propagates along single crystal index 232 of substrate 201, such that truncated cuboidal fin 202 includes: laterally-grown nanocrystal 204 including longitudinal length 213 and lateral length 214 that are different; charge injection facet 208 arranged along longitudinal fin axis 205 of truncated cuboidal fin 202, longitudinal fin axis 205 being disposed along single crystal index 232; and truncation facet 209 disposed opposing charge injection facet 208 and arranged parallel to longitudinal fin axis 205, such that in forming truncated cuboidal fin 202 a translation order and orientation order of laterally-grown nanocrystal 204 is controlled by a crystal symmetry of substrate 201; subjecting truncated cuboidal fin 202 to angular-directed passivation by a directed thermal deposition method such as electron-beam deposition, in which truncation facet 209 is contacted by passivation composition, and charge injection facet 208 is not contacted by passivation composition; forming, from passivation composition, passivation layer 224 on truncation facet 209 in response to subjecting truncated cuboidal fin 202 to angular-directed passivation by a directed thermal deposition method such as electron-beam deposition; subjecting truncated cuboidal fin 202 to angular-directed deposition as stated above, in which charge injection facet 208 is contacted by deposition composition, and truncation facet 209 is not contacted by deposition composition; and forming, from deposition composition, side-injector 203 on charge injection facet 208, by depositing thin semiconductor layers with proper doping and band gap energies, in response to subjecting truncated cuboidal fin 202 to angular-directed deposition to form light article 200.

The process for making a light article also can include: forming side-injection drain electrode 218 disposed on side-injector 203 by photopatterning and directed thermal deposition methods; forming side-injection source electrode 226 disposed on side-injector 203 and in electrical communication with side-injection drain electrode 218 through side-injector 203 by photopatterning and directed thermal deposition methods; forming dielectric member 216 disposed on side-injector 203 between side-injection drain electrode 218 and side-injection source electrode 226 by photopatterning and directed thermal deposition methods; and forming gate electrode 219 disposed on dielectric member 216 by photopatterning and directed thermal deposition methods, such that: gate electrode 219 is in electrical communication with side-injection drain electrode 218 and side-injection source electrode 226 through dielectric member 216; and dielectric member 216 is interposed between gate electrode 219 and side-injector 203, wherein side-injector 203 includes a semiconducting material.

The process for making light article 200 also can include connecting the devices to individual drivers to power up the light sources in an individual or array format.

Light article 200 has numerous advantageous and unexpected benefits and uses. In an embodiment, with reference to Example 1 and Example 2, a process for producing light with light article 200 includes: providing light article 200; providing electrons 222 to side-injector 203, side-injector 203 disposed on charge injection facet 208 opposing truncation facet 209 of truncated cuboidal fin 202; communicating electrons 222 from side-injector 203 to active layer 217; providing holes 223 to substrate 201; communicating holes 223 from substrate 201 to active layer 217; receiving, by active layer 217, electrons 222 from side-injector 203 and holes 223 from substrate 201; combining, in active layer 217, electrons 222 and holes 223; and producing light from combining electrons 222 and holes 223 in active layer 217.

Figure 8:
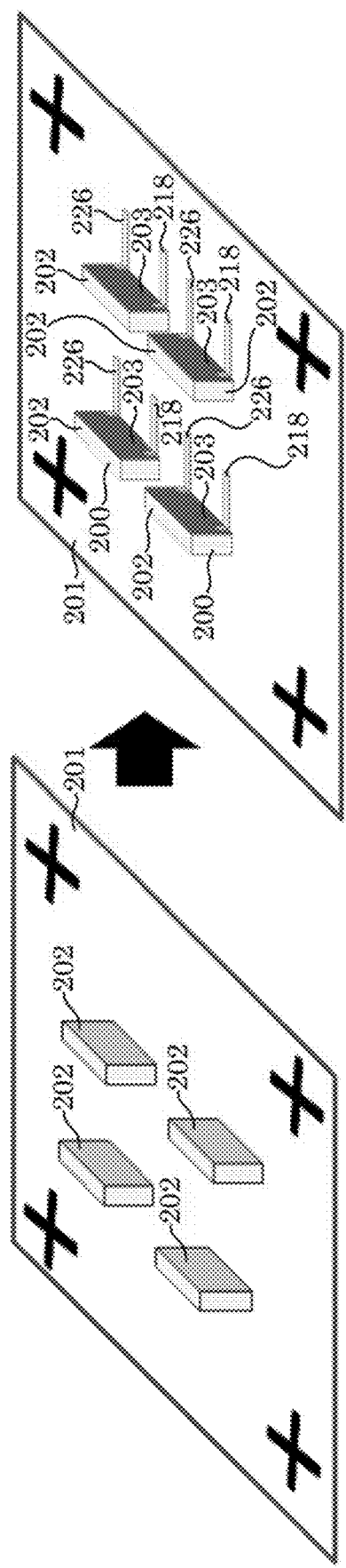
FIG. 8 shows a plurality of light articles disposed in an array.

In an embodiment, as shown in FIG. 8, a plurality of light articles 200 can be arranged in an array and individually addressed to selectively produce light from individual light articles 200. Using the same design, article 200 can be used as a light sensor. The bandgape of the layer 208 can be adjusted to sensitize truncated cuboidal fin 202 for different wavelengths ranging from UV, visible and infrared. Examples of materials for layer 208 is metal silicides including PtSi, NiSi and the like. The photodetector can work under no bias, i.e., photovoltaic mode, or could be operated under a small bias, i.e., photoconductive mode.

Light article 200 and processes disclosed herein have numerous beneficial uses, including bright light point sources in micro-displays, smart light sources, nanolasers, and visible light communication. Advantageously, light article 200 overcomes limitations of technical deficiencies of conventional planar p-n junctions such as efficiency droop.

Light article 200 and processes herein unexpectedly includes truncated cuboidal fin 202 that is free of threading dislocation (TD) defects. These defects reduce an efficiency of LEDs and lasers semiconductors as their dimensions are miniaturized.

The articles and processes herein are illustrated further by the following Examples, which are non-limiting.

EXAMPLES

Example 1. Breaking the Limit of Charge Injection in Nanocrystals: A Facet- and Orientation-Selective Electrical Charging Bottom-up nanocrystal growth methods and high-resolution top-down approaches can generate nanocrystals. In bottom-up growth, chaos at nanoscale, and in top-down growth, high cost of nanopatterning prohibited uniform charging of nanocrystals and scaling nanowire-devices. A side-facet charge injection design provides power-up of individual 1D-nanocrystals according to their orientation and at large scales. Direct measurement of total radiant flux of nano-light emitting diodes (nanoLEDs) of II-VI/III-V materials showed a record output power density of 710 W/cm$^2$, 230 times more than that of free-standing nanowires and 7 times more than thin film conventional LEDs. High brightness is attributed to effective side-facet charge injection that provides injection current density of 70 kA/cm$^2$ without decline in output power. Site-specific formation and charging of individual nanocrystals eliminate ultrafine lithography, making this method economic with impact on development of nanotechnologies that have remained cost-prohibitive due to small volumes and high manufacturing cost.

There is plenty of room at the bottom provided by controlling placement of miniaturized matter at nanoscale. The drive for miniaturization is in realization of devices with higher degree of intelligence and autonomy. Nanoscale materials include nanowires and one-dimensional (1D-) nanostructures as a building block, and such can function as transistors, field emission devices, solar cells, secondary batteries, chemical sensors, photonic sensors, light sources for micro displays and smart lighting. These nanotechnologies have a high cost for controlling order at nanoscale. The devices and processes in this Example are cost-effective fabrication strategies that control the chaos at nanoscale.

Fabrication technologies for transitioning microscale light sources to nanoscale in form of nanodiodes and nanolasers provide on-chip applications. Technological advance here includes bandgap engineering using small and wide-bandgap semiconductors and nanowires or one-dimensional (1D) nanostructures that have structural tunability in combination with other low-D materials such as quantum dots (QDs), quantum wells (QWs), or quantum disks (Qdisks) for UV to near-infrared light sources, coherent light sources below diffraction limit and single photon light sources. Integration of individual nanowires to a complex hierarchy is challenging due to intrinsic randomness of nanocrystal growth. Nanopatterning using high-resolution techniques can provide limited scalability. To overcome these technological problems, a process for making a light article 200 suppresses unpredictability in bottom-up growth in an absence of nanopatterning and providing efficient charge injection to nanocrystals. The architecture and method of integration herein provides cost effective and high throughput nanofabrication of 1D- and 2D-nanocrystals to electronic-photonic circuitries at a chip scale including optical sources at nano- and microscale.

Figure 12:
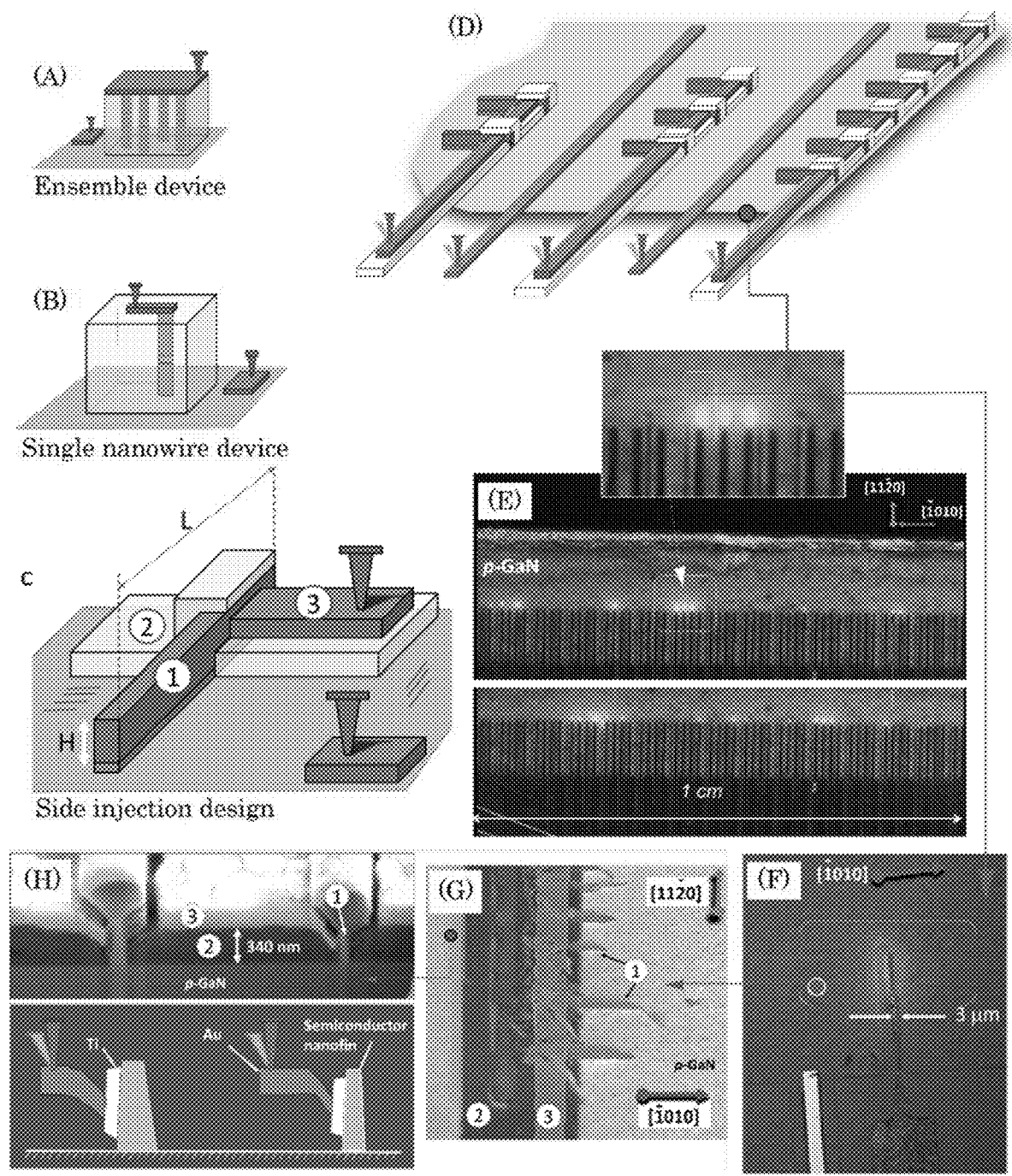
FIG. 12 shows cylindrical pillar-shaped nanowires having a common electrode disposed on in panel A; a cylindrical pillar-shaped nanowire in panel B; a light article in panel C; a plurality of light articles in panel D; optical images in panel E of a linear array of light articles arranged as n-ZnO/p-GaN nanoLED pixels in which top and lower panels show different pixels under an average driving current of 3 mA with an average turn on voltage of 9V, wherein an inset shows simultaneous operation of three adjacent pixels; in panel E 8 light articles as nanoLEDs that were powered with a top electrode; in panel F a scanning electron microscope (SEM) image of an oblique view of several light article as nanofin LEDs epitaxially grown on c-plane of GaN along its m-directions; and in panel H (top panel) an FIB-SEM cross-section of adjacent light articles as nanofin LEDs that received a top contact from their side and (bottom panel) different layers of light article 200 as a nanofin LED.

FIG. 12(a-b) shows conventional architectures for powering up free-standing, cylindrical nanowires. In the design of FIG. 12a, nanowires are integrated into a device by placing a common top electrical contact on top of the nanowires, and arrays of edge-emitting nanowire diodes or electrically-driven arrays of nanowire lasers were made. In creating such assemblies of nanoLEDs or nanolasers, bottom-up growth methods have been used, while in controlling uniformity of shape, diameter and spacing of nanowires, top-down nanofabrication methods have been a must to use. For in-situ charging of individual free-standing nanowires, top-down nanofabrication has been the main remedy (FIG. 12b). However, its limited scalability has prohibited the top-contact architecture to create large scale hierarchies for utilizing or scrutinizing their individual properties. In the top-contact architecture, the surface area of the metal-semiconductor interface at the ends of a nanowire is fixed and cannot be adjusted creating a bottleneck for charge injection, causing reduced power generation, device heating and potential instability.

FIG. 12c shows a light article that includes a laterally grown nanocrystal (1) that is facet-specifically passivated with a dielectric layer (2) to receive a metal electrode (3) for charge injection to side facet of the nanocrystal where the nanocrystal has a predictable orientation. As described below, a charge injection area on the nanocrystal side facet can be increased to several square microns proportional to the length (L) and height (H) of the nanocrystal, increasing injection efficiency and reducing junction heating. Additionally, without high-resolution lithography nanocrystals, with sub-200 nm dimension are formed that are electrically-addressable at very large scales (FIG. 12d).

A large-scale side-facet charge injection is shown in the optical image of FIG. 12e for charging up a linear array of 60 pixels (devices) with a pitch of 120 µm across a 1 cm length, where each pixel contains 1 to 10 nanofin LEDs. NanoLEDs are located toward the end of the top metal contacts and that is why under forward bias, bright spots appear at the end of the microelectrodes (inset of FIG. 12e) and FIG. 12f. Tilted view of a representative pixel in FIG. 12g shows each nanoLED (labeled 1) is a ZnO nanofin laterally grown in [01–10] of p-GaN forming an elongated p-n heterojunction at its interface with c-plane of GaN. A ZnO nanofin is first oxide-passivated (labeled 2) from all facets except one to intentionally form an interface with the top metal electrode (labeled 3). By controlling nanofins orientation order, uniform and predictable interfaces can be made between its side facet and the top contact of the SEM cross-section shown in FIG. 12h. The linewidth of the top metal contact that defines the metal-semiconductor interface area can be chosen to be as wide as selected to cover the entire side-facet of the nanofin.

To selectively place the top metal contacts on a certain side facet of nanofins, fabrication processes ensured predictable formation of a pristine semiconductor surface for an unimpeded charge injection channel. Lateral epitaxy made nanowires and nanofins to control the crystallographic directions of the side facets and an adjustable heterojunction length relative to free-standing nanowires. Surface-directed vapor-liquid-solid (VLS) growth was used to grow nanocrystals. The surface-directed VLS growth is a substrate-assisted nanocrystal growth that provided translational and rotational orders of nanocrystals on a large-scale, eliminating architectural disadvantages of free-standing nanocrystals. A metal catalyst droplet such as gold (Au) acts as a nucleation center that leads the in-plane nanocrystal growth. Integration of n-ZnO/p-GaN nanoLEDs is a complex case of chaos control because ZnO nanofins grow in six possible directions according to the $C_6$ symmetry of GaN, in contrast, to simpler two-direction growth on a-sapphire that has a $C_2$ symmetry.

Figure 13:
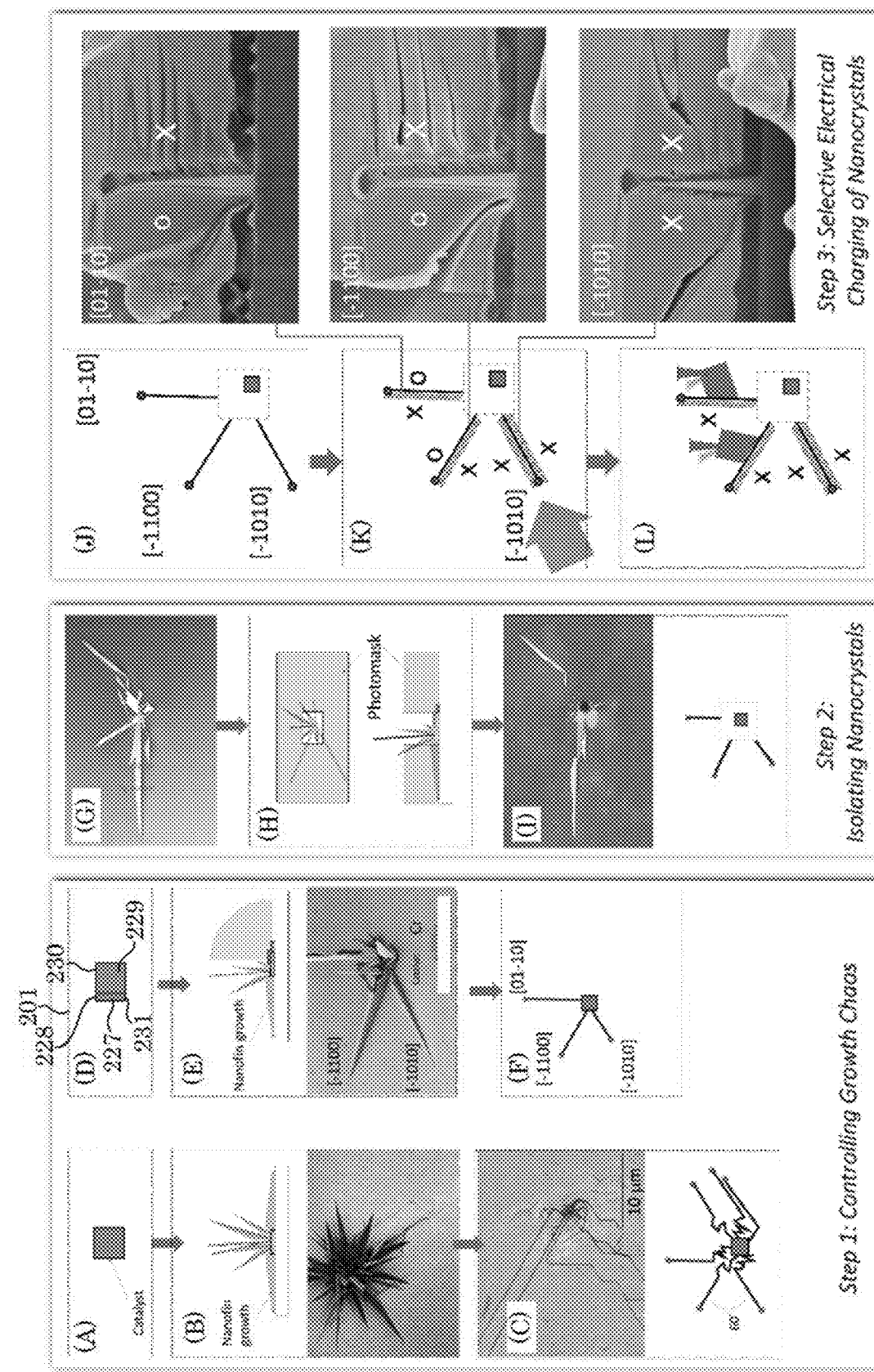
FIG. 13 shows in panel A, B, and C non-selective formation of truncated cuboidal fins; in panels D, E, F, G, H, and I selective formation of a truncated cuboidal fin along a single crystal index of a substrate in a presence of a catalyst as the catalyst propagates along the single crystal index of the substrate; and formation of a light article from a truncated cuboidal fin in panels J, K, and L.

In surface-directed VLS process, although the lattice structure of the substrate can impose the ultimate boundary conditions to have a strict control over order of grown nanocrystals, experimental results show that the growth kinetics could substantially scramble the Au droplet trajectory on the surface when there are multiple competing nucleation centers at a given site. This phenomenon often results in growth of multiple nanowires per site and randomness of directionality (FIG. 13). Control of this chaos during growth occurs by reducing the number of nucleation centers (or metal catalyst droplets) per site via high-resolution lithography.

Microscale patterns (FIG. 13a-b) as large as 3 µm² typically produce dozens of standing and horizontal nanocrystals per site, where a poor directionality is observed for the lateral ones. The loss of directionality appears at the early stage of the lateral growth within a radius of few microns of the catalyst pattern (FIG. 13c). The origin of this scrambling effect to the growth competition can be between free-standing and lateral nanocrystals, where surface collection areas of nanocrystals for capturing gas phase materials overlap. Loss of directionality is observed in the lateral growth of other semiconductors such as ZnO, GaN, or ZnSe on sapphire when large size catalyst patterns used, limiting their use in scalable device integrations based on the surface-directed VLS.

To enable using microscale catalyst patterns for creating device quality nanocrystals, we impose control mechanisms to minimize the undesired growth kinetics affecting directionality of the nanocrystals. As shown, these fabrication strategies achieve control to electrically charge 1, 2, or a few nanocrystals per site on a large scale. In FIG. 13d, the scrambling of the lateral nanocrystals at the early stage of the growth is suppressed by reducing the number of free-standing nanowires via masking part of the Au catalyst patterns using a benign material such as chromium (Cr) or silicon oxide (SiO$_2$). This treatment controllably reduces the active Au catalyst area and quenches most of the free-standing nanowire growth (FIG. 13e). It reduces competition with the lateral growth and allows lateral nanocrystals to predictably grow in their intended crystallographic directions. In the case of (0001) GaN substrate with six allowed-directions along its m-directions, nanofins grow in two or three dominant orientations of [−1010], [−1100], and [10−10] at the catalyst site (FIG. 13e-f). The laterally grown nanocrystals are interconnected at the initial catalyst site via a thick polycrystalline semiconductor film. The defective layer is eliminated via a chemical etch step (FIG. 13c). The outcome of these two steps provide isolated nanofins with sub-200 nm dimensions that are formed at predefined sites using micropatterning, showing that this method is a high-resolution but low-cost method for large scale generation of semiconductor nanostructures. In the case of ZnO nanofins, hydrochloric acid is used in a wet chemical-etch process to remove the initial catalyst site and separate the nanofin crystals (FIG. 13 g, h, i).

To place electrical contacts specifically on nanofins with certain crystallographic directions at a large scale, specific group(s) of nanofins were targeted with known orientation(s). This is possible as the global (translational) and local (orientation) orders of lateral nanocrystals are controlled by the crystal symmetry of the substrate. Facet passivation is programmable and carried out via angled-deposition of a thin dielectric layer along the direction of the nanofins that are to be fully passivated. An example for the three dominant directions of ZnO nanofins on GaN is shown in FIG. 13j where directed oxide deposition (FIG. 13k, indicated by arrow) on nanofins at [−1010] direction resulted in their full passivation as seen from the cross section of the nanofin in the inset (coated facets marked with x). The other two directions of [−1100] and [01−10], also presented in the insets, are only passivated from one-side. Therefore, for a population of ZnO nanofins with these three orientations, the first round of oxide deposition leaves two orientations electrically accessible and by the $2^{nd}$ round of directed deposition along another nanofin direction, e.g., [−1100], the remaining orientation of nanofins, i.e., [01−10] becomes accessible. A thin layer of conductive indium tin oxide is deposited as the top contact to highlight the open facets in contrast to the oxide-coated ones.

Control measures developed in steps 1 and 2 (FIG. 13), enable the nanocrystals to be receptive of additional layers for device fabrication using conventional optical lithography. Traditional photolithography techniques use two steps of deposition and etch in fabrication processes. Here, an additional step forms single crystalline nanostructures commensurate with the deposition and etch steps. In the third step shown in FIG. 13, a top metal electrode can be introduced to the open side facet of the nanofins (see FIG. 13i) by depositing the metal layer opposite to that of the oxide layer. The interface area between metal and semiconductor is large and defined by the width of the metal electrode (W) and height of the nanowire or nanofin (H). Conventional techniques for in-situ integration of free-standing nanowires as nanoLEDs or nanolasers involve exposing the upper ends of the nanowires via etching a supporting matrix for receiving a common metal contact (FIG. 12a). In some conventional methods, free-standing nanowires are overgrown to merge and form a continuous upper surface that can receive the top contact. In these conventional methods, charge carrier injection area is limited to the small cross-section of the nanowires, causing a bottleneck in charge transport accompanied by heating and lower efficiencies than thin film LEDs.

Figure 14:
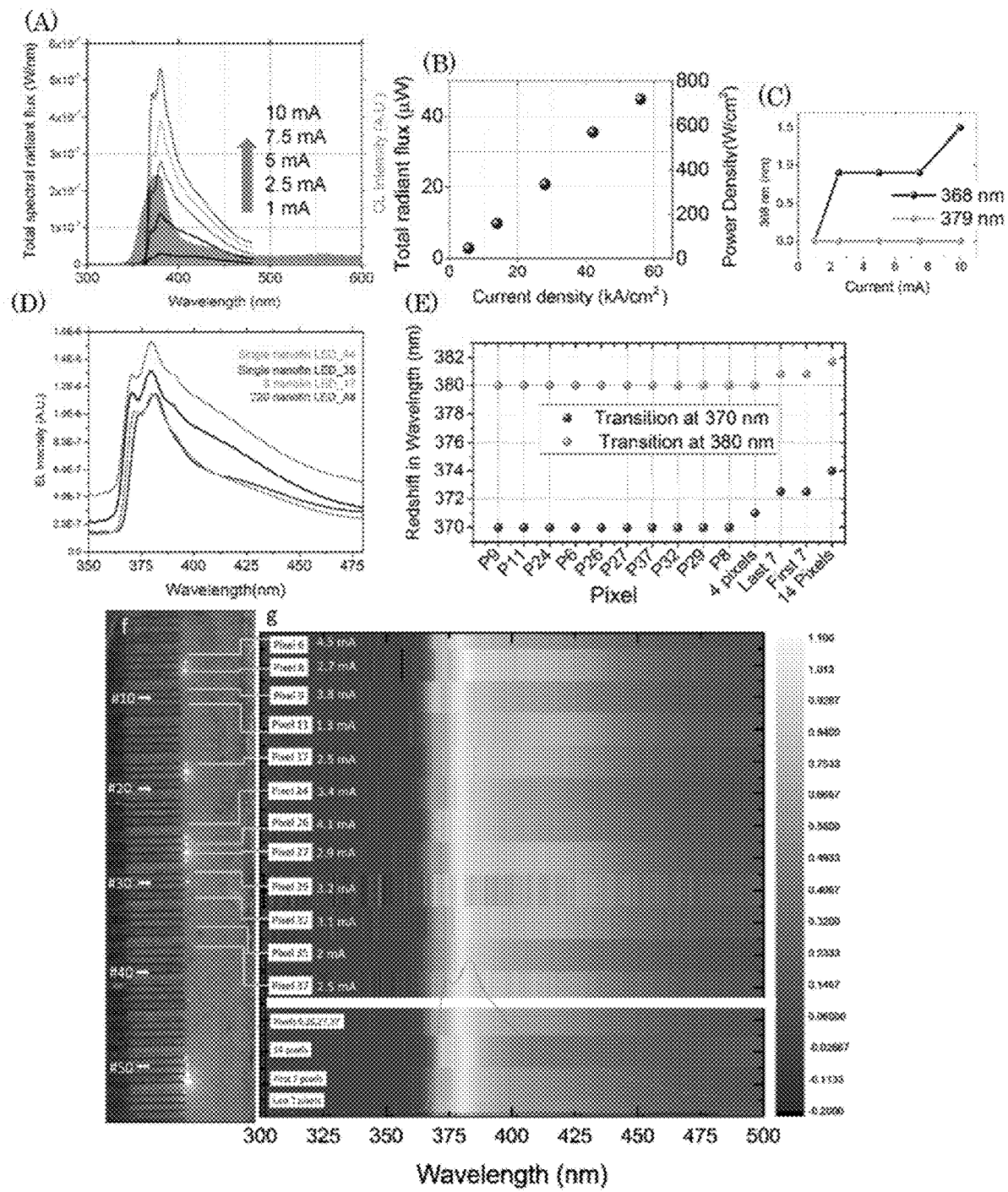
FIG. 14 shows in panel A EL spectra of a group of 8 light articles as nanoLEDs for an injection current increase from 1 mA to 10 mA, wherein the filled curve is for CL emission of a ZnO/GaN heterojunction at 2 k eV; panel B shows an output power and power density versus injection current density without device cooling; panel C shows an EL peak at 370 nm redshifted 1.5 nm at 10 mA injection current, and the 380 nm peak showed no change; panel D shows, from top to bottom, normalized EL spectra of devices #44 (at 2 mA drive current), #35 (at 2 mA drive current), and #17 (at 10 mA drive current) compared with EL of 14 pixels turned ON in parallel (at an average 3 mA drive current); panel E shows a dependence of redshift of the UV EL peaks at 370 nm and 380 nm on a number of operating pixels; panel F shows an optical image of the nanoLED pixel array with their 2D EL image in panel G; and panel G, upper part, shows an EL image of individually operated pixels at indicated driving currents, wherein the EL spectrum is overlapped with the 2D image to show UV peak positions and uniformity across different pixels, and the lower part shows behavior of groups of 4, 7 and 14 pixels, wherein the latter shows a redshift relative to the rest of the pixels. The faint color in the 2D map from 400 nm to 430 nm is emitted photons generated in a p-GaN side of the heterojunction.

FIG. 14a shows an electroluminescence (EL) spectrum of this pixel acquired with a calibrated spectrometer with a resolution of 0.3 nm. Based on the appearance of two intense emissions at 370 nm, and 380 nm, two main charge recombination channels exist in these p-n heterojunctions. Narrow full-width at half-maximum (FWHM) of only 5 nm and 18 nm are observed for these emissions, despite the absence of any charge confinement mechanism such as quantum wells in such p-n junctions. Energetically, these electronic transitions overlap well with the room temperature cathodoluminescence (CL) of ZnO nanofins/GaN heterostructure (FIG. 14a, filled curve) an indication of charge recombination in the ZnO side of the heterojunction. The first emission at 368 nm (3.36 eV) is assigned to the free-exciton recombination within ZnO band gap, while the peak at 379 nm (3.28 eV) is assigned to donor-bound exciton recombination. The absence of EL emission at reverse bias revealed negligible mid-gap defect states in ZnO at the interface in contrast to the previous reports. The strong ZnO excitonic peak at 368 nm and its comparable intensity with the 379 nm peak is indicative of lower concentration of donor sites (such as oxygen) than what is observed in n-type ZnO nanowires. Furthermore, the observation of flow of holes under forward bias from p-GaN to the ZnO and their recombination in the nanofin also supports the lower carrier concentration in ZnO at the vicinity of its interface with GaN. The second pathway for electron-hole ("e-h") recombination is in the p-GaN side of the heterojunction that results in the red shoulder seen in the EL spectra of FIG. 14a. Deconvoluting the electronic transitions reveals two emissions at about 403 nm and 430 nm that have been attributed to Mg ion acceptor to valence band.

Fabricated NanoLED pixels under a direct current (DC) forward bias are bright enough to be visually seen without using any light collecting optics or reducing the background light (FIG. 12e). This allowed measurement of their total radiant flux in a 7 ft diameter integrating sphere. Our measurements show that at a 10 mA drive current a pixel containing 8 nanofin LEDs with a total heterojunction length of 39 µm and a width of 160 nm can generate 718 W/cm$^2$±10%, a power density 7 times more than that of a commercial 100 W/cm$^2$ thin film LED (FIG. 14b). This output power translates to about 1 µW power per 1 µm of nanoLED length that is 230 times stronger than the power density generated by the state-of-art top-facet charge injection design used in the free-standing nanowire LEDs. As shown in FIG. 14b, using the side-facet charge injection design and a charge injection area of about 3 µm$^2$, can receive current densities ranging from 70 to 90 kA/cm$^2$. This is at least ten times more than the previously reported values in charging free-standing single nanoLED pixels with an average diameter of 240 nm. As the injection current increases, the intensity of the two UV peaks and output power increase linearly (FIG. 14b) with no obvious shift at the 379 nm peak (FIG. 14c, dots) indicating the remarkable efficiency of nanofin LEDs in dissipating self-heating under an unusually high current density.

Device heat generation can cause a redshift in the LED's emitting wavelength due to the lattice expansion and bandgap reduction. Self-heating has been a disadvantage in powering up nanoLEDs as their packing density on the increase, resulting in drop in their output power. In our nanoLEDs, it is noted that as the injection current increase, the 370 nm ZnO exitonic emission that is more sensitive to the ZnO lattice temperature shows a slight redshift of about 1.5 nm at 57 kA/cm$^2$ that we attribute to the lattice expansion and a subtle Joule heating at the junction. Blueshift in the UV EL emissions was not observed. Blueshift can be due to band-filling or piezoelectric field effects that are reported in GaN-based LEDs, ZnO/GaN film LEDs, or nanowire heterojunctions. Absence of the blueshift in our nanofin LEDs is attributed to a reduced polarization-related electric fields in the nanocrystal due to the side-charge injection to the non-polar (11-20) facet of ZnO. This is an advantageous feature in creating sub-200 nm Wurtzite crystals such as ZnO or GaN as it could suppress or eliminate the polarization-related electric fields and increase charge recombination efficiency of nanoscale heterojunctions. Currently, crystals with non-polar facets can be prepared with selective area growth (SAG) methods in form of nanofins or nanopillars; however, in addition to the high cost of scaling-up, extension of threading dislocations (TDs) to the nanocrystals cannot be eliminated. TD defects are shown to impact the radiative recombination efficiency in the device active region.

Statistical information can be extracted using the architecture because nanofins can be powered in different regions along the device array. This can occur while current measurements are either performed on single nanoLEDs sampled from a large group or on large ensembles. In FIG. 14d, EL spectra of pixel #17 with 8 nanofin LEDs is compared with pixels #35 and #44 containing single nanoLEDs that are spaced 2.16 mm and 3.24 mm apart. These three pixels show similar UV peaks at 368 nm and 379 nm demonstrating the uniformity in chemical structures of the formed nanoscale heterojunctions irrespective of the number and length of nanofins and their spatial locations. As seen in device #17, at an injection current of 10 mA, corresponding to a 56 kA/cm$^2$, the exitonic peak at 368 nm only redshifts about 1.5 nm relative to single nanofin LEDs #35 and #44 operated at 2 mA. This is an example of detecting a microscale heating effect in nanoLEDs that corresponds to a 46° C. rise in temperature. Here, an injection current regime leads to heating and droop that can reduce LED output power, but our results shows the potential of this charge injection architecture for driving nanoLEDs in the absence of cooling mechanisms or pulsed-biasing. This figure also compares the local heating effect of pixel #17 with a group of 14 pixels (≈220 nanofins) operating in parallel for a similar duration of time. Although the average driving current is 3 mA, we observe a 4 nm redshift in the more sensitive exitonic emission at 370 nm, corresponding to a temperature rise of 123° C. No suppression of this peak's intensity is observed, illustrating the strength of ZnO as a material for high temperature LED applications. The 4 nm redshift is assigned to a global heating due to simultaneous operation of 14 pixels across the 1 cm chip.

During operation of individual pixels as shown in FIG. 14e, no discernable wavelength shift was observed; however, the increase in the redshift becomes detectable as the number of operating pixels increased. For instance, redshifts of 1 nm and 2.5 nm at the 370 nm peak was measured, respectively, when four and seven pixels were turned ON. The peak at 380 nm showed the same trend but with a smaller redshift as seen in the figure. We attribute the global heat accumulation on the chip, primarily, to the poor heat conduction of the thermally-insulative chip carrier package used in this experiment. By constructing a two-dimensional (2D) EL map of nanoLED pixels across the 1 cm chip, our results can be used to deduce valuable analytical information such as spatial uniformity of chemical composition/structure of the ZnO/GaN heterojunctions or physical properties such as device heating or contact resistance on spectral characteristics of the nanoLEDs. As evident in this map, appearance of nearly identical UV peak energies at 370 nm and 380 nm (red curve) for all pixels demonstrate the high quality of ZnO nanocrystal over the entire chip.

Example 2. Droop-Free Fin Light-Emitting Diodes (LEDs)

Efficiency droop refers to a decline in brightness of LEDs at high electrical currents and is a technological barrier for realization of high-brightness LEDs. We present a fin LED architecture that eliminates efficiency droop. These fin LED nanoscale heterojunctions can sustain record current densities of more than 1 million A/cm$^2$, 10000 times more than what is attainable in conventional LEDs and junction temperatures over 340° C., about 200° more than allowed temperatures in typical LEDs, without any decline in efficiency. At estimated 15% light extraction efficiency, fin LEDs generate an output power density of 45 W/cm$^2$ at 100 mA, comparable to planar LED performance and a factor of 10 higher than free-standing nano LEDs. Modeling suggests that spreading of the electron-hole recombination region in fin LEDs at high injection levels suppresses the non-radiative Auger recombination processes. The fin geometry is estimated to result in at least 10 to 100 times brighter LEDs, enabling the development of a new generation of LEDs for macro- and micro-scale applications.

Since the breakthroughs in GaN blue light emitting diode (LED) technology and the subsequent realization of white LEDs, great progress has been made in wide bandgap (WBG) semiconductor LED lighting for general illumination, display, and many other applications including biological sensing, surface disinfection and sterilization, visible-blind photodetectors, visible light communication, acoustic-optoelectronics, and terahertz electronics. A technical challenges of WBG LED technology is efficiency droop, i.e., a decline in internal quantum efficiency (IQE) with increasing current density. This phenomenon has limited the performance of some conventional LEDs. Efficiency droop has been linked to Auger recombination, phase space filling, stimulated emission, delocalization-activated nonradiative recombination, and incomplete carrier localization. The droop increases with junction temperature, although it is pronounced even at lower temperatures. This Example describes a p-n heterojunction ZnO—GaN fin LED that intrinsically does not show the droop effect even at extremely high current densities. ZnO has a Wurtzite crystal structure and a bandgap ($E_g$) of 3.36 eV, similar to GaN ($E_g$=3.43 eV). It has a considerably larger exciton binding energy of about 60 meV (relative to 24 meV in GaN) making it more effective for high temperature light sources and opto-electronics resistant to radiation damage.

Figure 15:
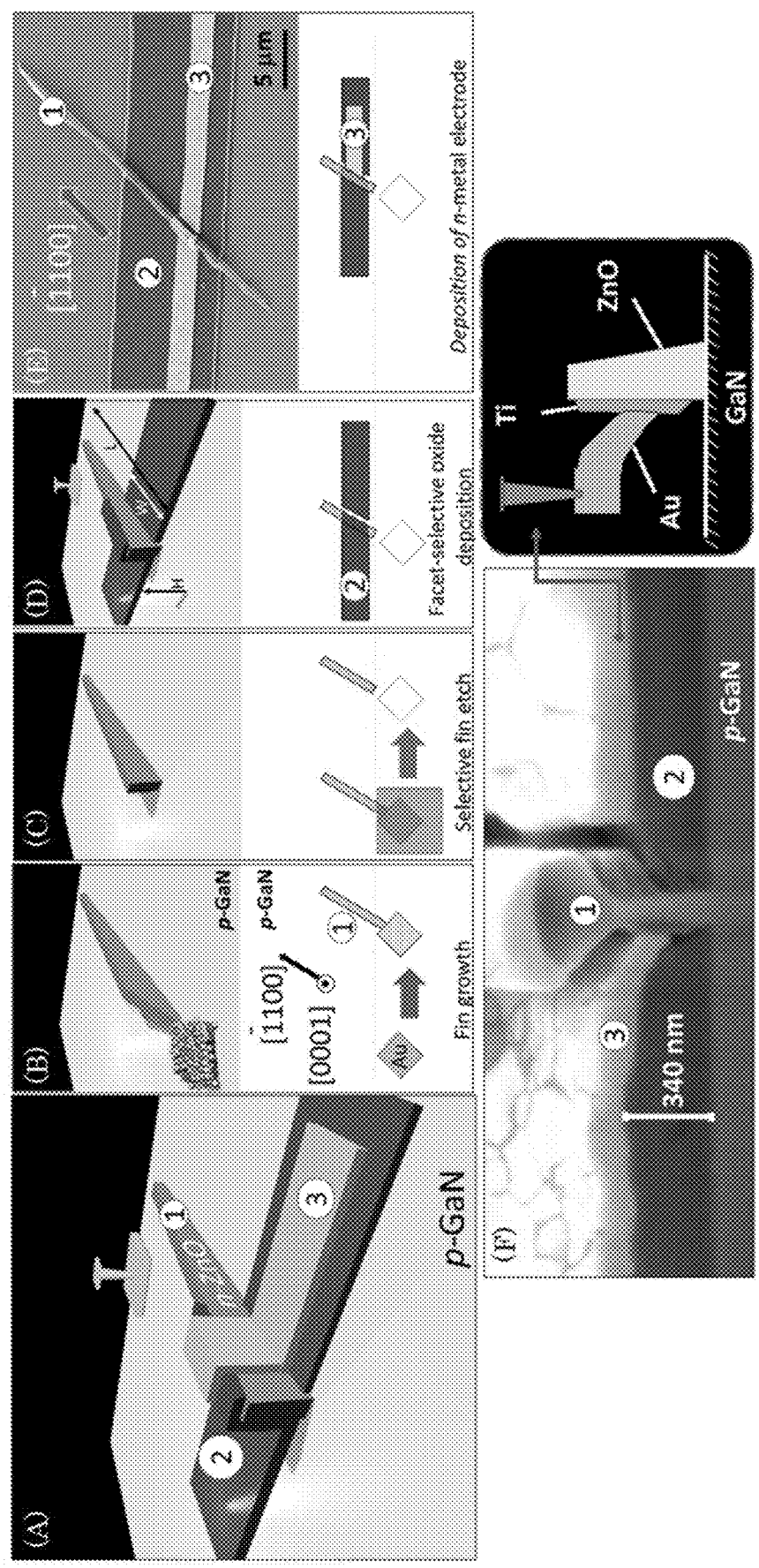
FIG. 15 shows aspects of architecture and fabrication steps for making a light article that includes an n-ZnO truncated cuboidal fin LED on a p-GaN substrate, wherein in panel A, a fin LED pixel includes a truncated cuboidal fin as an n-ZnO fin (1), a dielectric member as a dielectric layer (2), and a side-injector as an n-metal contact (3); panel B shows surface-directed ZnO fin epitaxially grown on c-plane GaN from an Au catalyst pattern via surface-directed VLS growth process; panel C shows isolated fins formed by removing the initial catalyst site via photolithography and wet etch; panel D shows a truncation facet passivated via photolithography and angled-oxide deposition, wherein an open facet has an approximate area of H×W, where "H" is height and "W" is width. The maximum length of W can be the fin longitudinal length (L); panel E shows a charge injection facet receives the n-metal contact; and panel F shows an electron micrograph of a cross-section of a light article as an LED, wherein an inset shows the truncated cuboidal fin, n-metal contact side-injector, and GaN substrate.

The fin LED architecture shown in FIG. 15a includes a lateral ZnO nanofin (1) epitaxially grown on p-GaN. The fins are grown via an Au-catalyzed vapor-liquid-solid (VLS)-growth process that is directed on the surface, where the Au nanodroplets formed at the periphery of the catalyst pattern nucleate the nanofins (FIG. 15b). On c-GaN, ZnO fin grows upright in the direction and laterally in the m-direction. A ZnO fin could have one or two large non-polar (11 $\bar{2}$0) side facets. Fabrication of the fins is completed by connecting n-type fins to the n-metal electrodes. We used a "facet-selective contact" method (FIG. 15c-d) in which one of the fin side facets is first passivated with a dielectric layer (2), deposited at an angle (FIG. 15d). The other non-polar side facet remains accessible to receive the n-contact metal electrode (3). The design provides large-area low-resistance contacts. The side-facet selective contact also results in facile formation of clean metal-semiconductor interfaces as shown in the cross-section of FIG. 15f.

Figure 16:
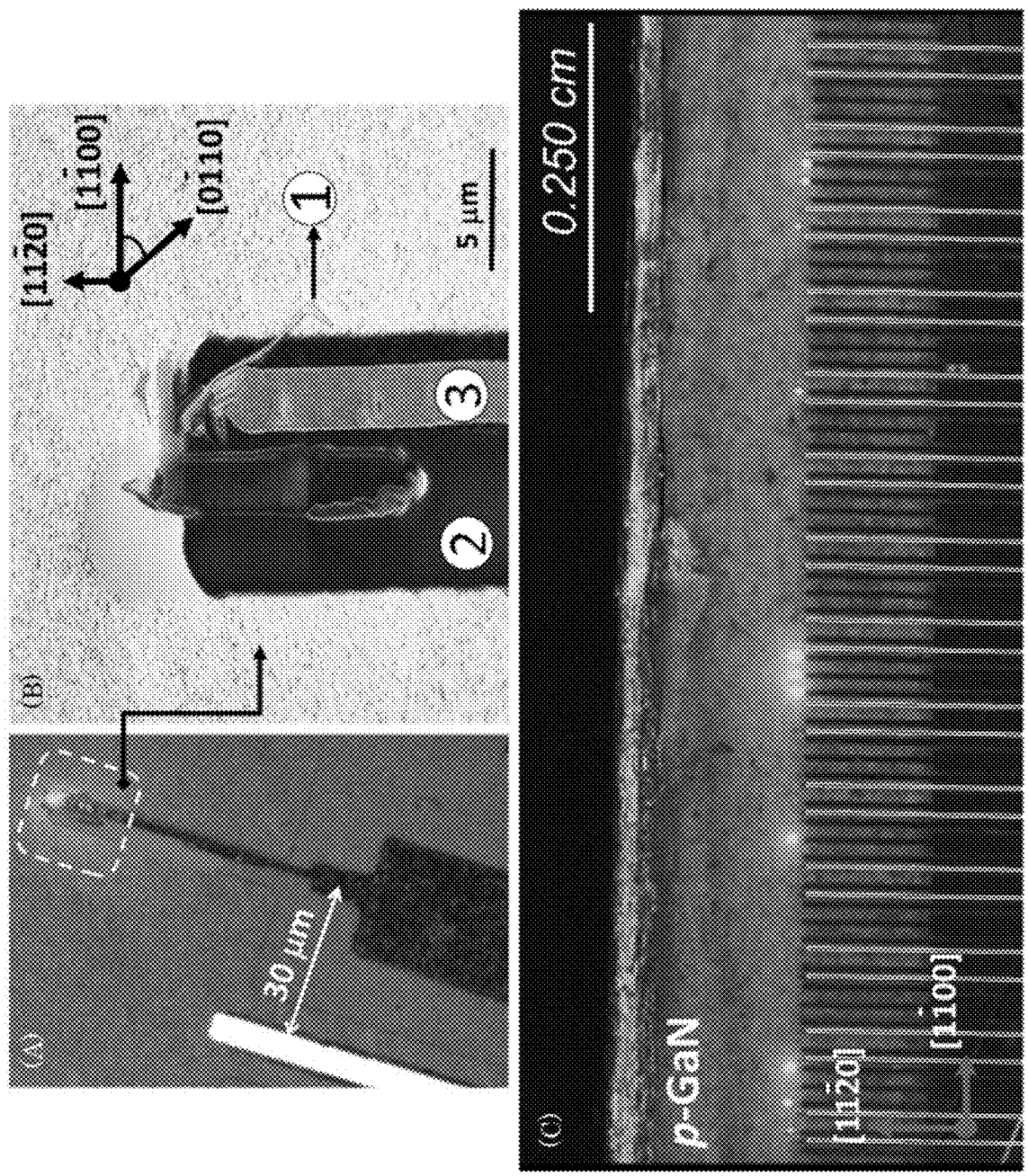
FIG. 16 shows a light article LED pixel in panel A as an optical image for a single truncated cuboidal fin with side-injector 203 electrode on a left side as a p-metal contact and a marked area of the light article LED under forward bias; panel B shows an SEM image with different layers of the pixel and GaN crystallographic directions; and panel C shows an optical image of a linear array of light article as LED pixels, wherein bright spots are fin LED pixels that are ON, and light vertical lines are positions of p-contact electrodes relative to n-contacts. ZnO truncated cuboidal fins grew in $[1\bar{1}00]_{GaN}$ and $[0\bar{1}10]_{GaN}$.

FIG. 16 presents the optical image (a) and the magnified scanning electron microscope (SEM) image (b) of a fin LED (under operation) containing a single fin and its n- and p-metal contacts. Electrically-addressable fin LED pixels can be fabricated using standard photolithography. FIG. 16c shows an example of a linear array. In this optical image, the fin LED pixels containing 1 to 10 fins are spaced 120 μm apart across a 1 cm range. For better current spreading in the p-GaN layer, the p-contact microelectrodes (yellow highlights) are spaced every 150 μm.

Figure 17:
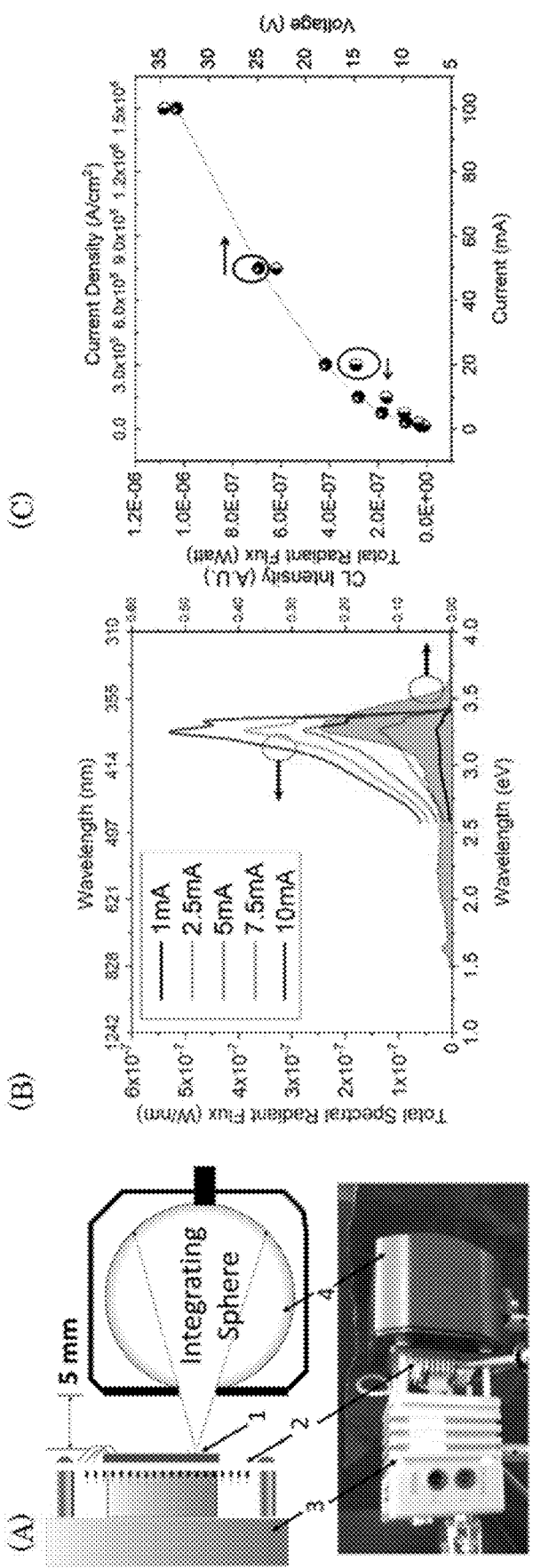
FIG. 17 shows electroluminescence and output power of light articles as fin LEDs, wherein panel A shows a wire-bonded array of fin LEDs mounted in front of a 44 mm diameter integrating sphere that is connected to a calibrated metrology-grade CCD-array spectroradiometer using an optical fiber bundle. Fin LED pixel (1); chip carrier (2) mounted on a stage (3); detector (4). Panel B shows a total spectral radiance flux (W/nm) of a representative pixel containing 8 light article LEDs as injection current increased from 1 mA to 10 mA. Each spectrum is an average of five measurements with a total time of 325 s. UV emissions are shown at 368.5 nm (3.369 eV) and 378.5 nm (3.280 eV). The filled spectrum is the cathodoluminescence (CL) of a single ZnO fin at 2 keV; panel C shows total output power (left axis) and voltage-current data (right axis) of a representative pixel containing 3 light article fin LEDs at different injection currents of 1 mA to 100 mA.

Fin LED pixels are bright enough so that the individual pixels in the wire-bonded linear array can be directly measured in front of a metrology-grade charge-coupled device (CCD)-array spectroradiometer with no focusing optics (FIG. 17a). For each pixel, a bright emission appears at the location of the p-n heterojunction at forward bias. The electroluminescence (EL) spectra of individual fin LED pixels were measured at different currents. FIG. 17b shows a series of the representative spectra obtained from a pixel containing eight nanofins, with an average fin length of 5 μm and height of 1 μm. When the current increases, two peaks at 3.369 eV (368.5 nm) and 3.280 eV (378.5 nm) appear. These wavelengths agree with the neutral donor bound exciton ($D^0X$) recombination in ZnO. Observation of these two peaks at room temperature and their agreement with the room temperature cathodoluminescence (CL) data highlights the high quality of the ZnO fins and underlines the low concentration of the donor states relative to what is typically observed in unintentionally n-doped ZnO nanowires. A low concentration of donor states is also evidenced by the flow of holes from p-GaN to the n-ZnO and their recombination in the ZnO fin. Furthermore, the narrow full-width at half-maximum (FWHM) of only 5 nm and 18 nm for these two emissions shows the low defect density of the fins. At lower injection currents, the appearance of the red shoulder at about 420 nm indicates radiative e-h recombination in GaN, due to the slow movement of holes toward the p-n interface. As the drive current increases, the intensity of the ultraviolet (UV) EL peaks at 368 nm and 378 nm continues to rise while the e-h recombination in GaN is suppressed.

Figure 18:
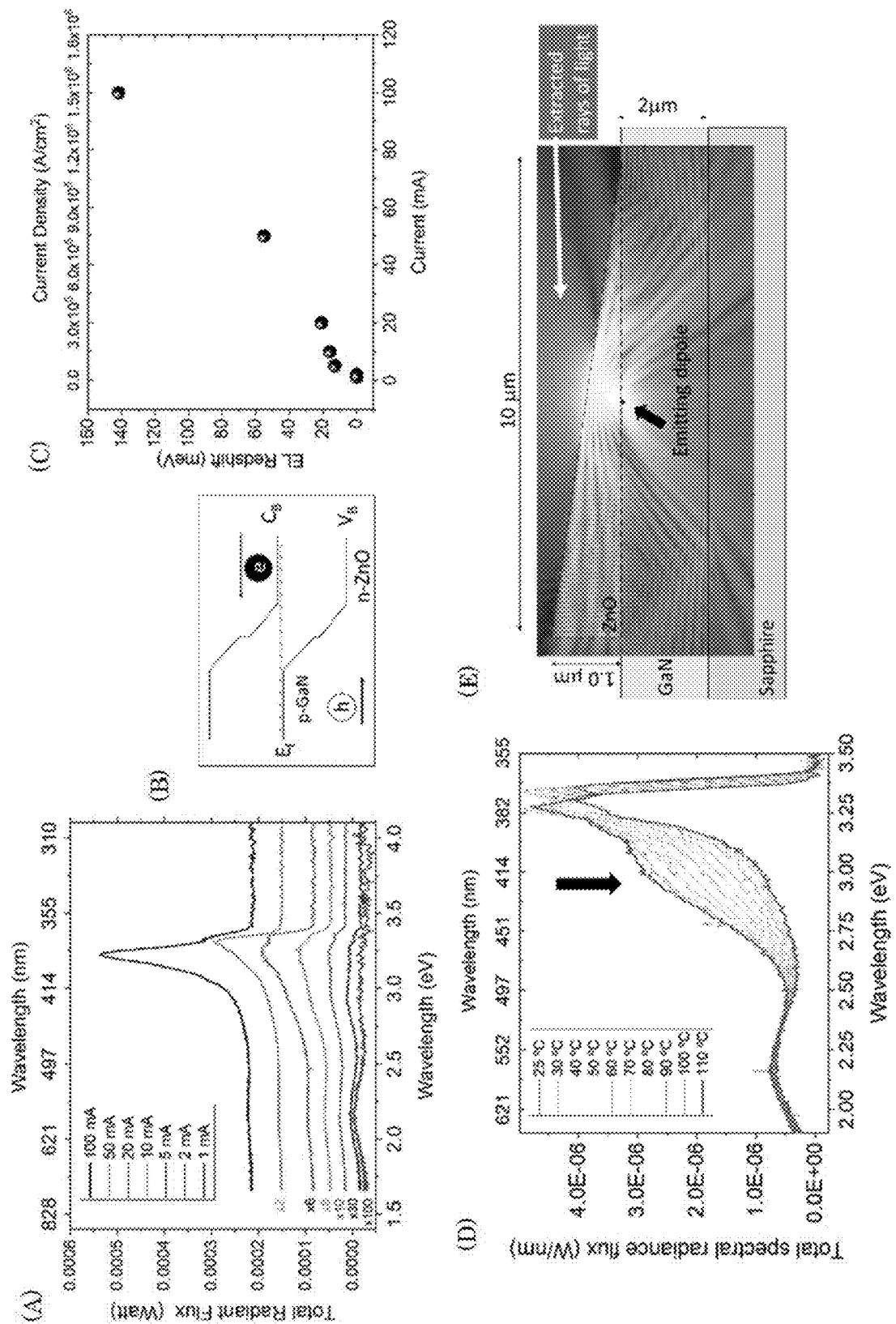
FIG. 18 shows electroluminescence of light articles as fin LEDs at high current density and heat. Panel A shows a total spectral radiance flux (W/nm) of a representative pixel containing 3 fin LEDs as injection current increased from 1 mA to 100 mA. The respective acquisition time at each drive current was 50 s, 25 s, 10 s, 5 s, 2.5 s, 1 s and 0.5 s. Panel B shows ZnO—GaN band structure. Panel C shows UV peak position redshifts (in eV) as current increased. The expanded uncertainty of the measured peak position is less than 0.5 nm, with coverage factor of k=2. Panel D shows a change in EL of the fin LED pixel at a low current load of 2 mA as temperature increased from 25° C. to 110° C. using a temperature-controlled stage. The emission at 420.2 nm (2.955 eV) due to electron and hole recombination in a side of GaN does not redshift, but is suppressed as temperature reaches 110° C. The intensity of the first UV emission related to electron and hole recombination in the ZnO fin at 368.5 nm (3.369 eV) was nearly constant, but redshifted 4.8 nm and nearly overlapped with a second UV peak. Panel E shows an FDTD simulation of light extraction from a fin LED viewed from the longitudinal side of the fin. A single dipole is oriented 45 degrees at the interface. Light rays leave more from the charge injection facet of the truncated cuboidal fin, and a model showed about 8% emission from side facets and 7% from the top facet.

To further explore the impact of drive current on the output power and spectral properties of fin LEDs, the total spectral radiance flux (W/nm) of a pixel containing three fins was investigated up to 100 mA (the limit of the measurement setup) using the integrating sphere described in FIG. 17a. The pixel was operated under a direct current (DC) bias for the operation times of 50 s, 25 s, 10 s, 5 s, 2.5 s, 1 s and 0.5 s and for the current range of 1 mA, 2 mA, 5 mA, 10 mA, 20 mA, 50 mA, and 100 mA, respectively. During each measurement, a 10-minute rest time was given so that the fin LED can reach the equilibrium temperature of 25 (±0.1) ° C. established by a temperature-controlled stage. The total spectral radiance-current (L-I) graph of FIG. 17c (dark circles) shows that the 100 times increase in the injected current results in ≈108 times increase in the output optical power of the fin LED. This observation indicates that at high currents, carrier loss due to non-radiative events is well controlled. Loss of carriers inside the active region at high current injections is one of the main processes that promotes the efficiency droop. As current is increased, the rise of intense UV EL peaks in the range of 368 nm to 390 nm (3.37 eV to 3.18 eV) in FIG. 18a shows that the radiative recombination occurs in the ZnO fin, as shown in the band structure of the ZnO—GaN heterojunction (FIG. 18b). In contrast to other types of LEDs, flow of electrons (electron leakage) to the p-GaN is not observed in fin LEDs. Such leakage is an important factor in promoting the droop effect at high current densities.

Figure 20:
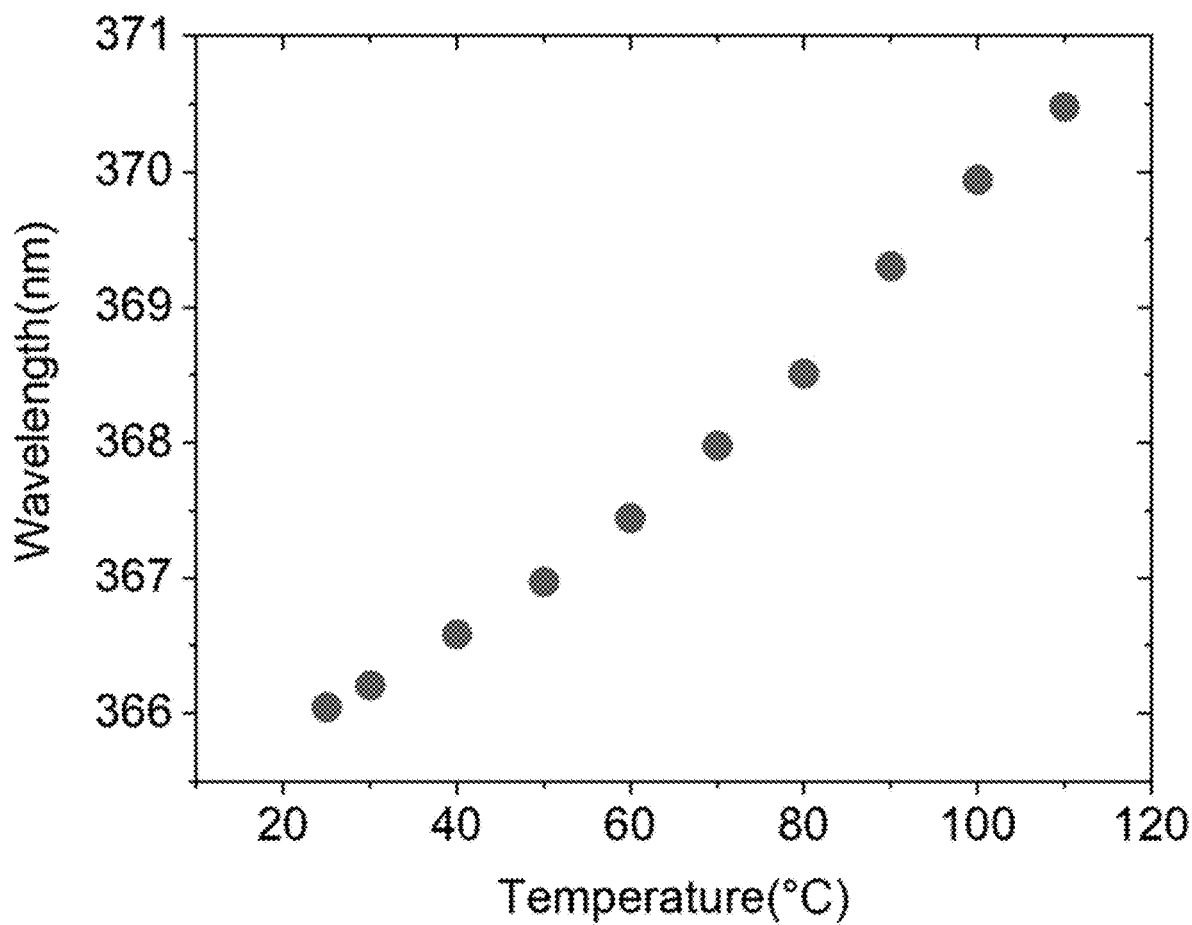
FIG. 20 shows a redshift in UV EL peak at 368 nm of light articles as fin LEDs as a mount temperature was increased from 25° C. to 110° C., wherein a pixel included 3 fin LEDs and was driven at 2 mA of DC current at each temperature.
Figure 21:
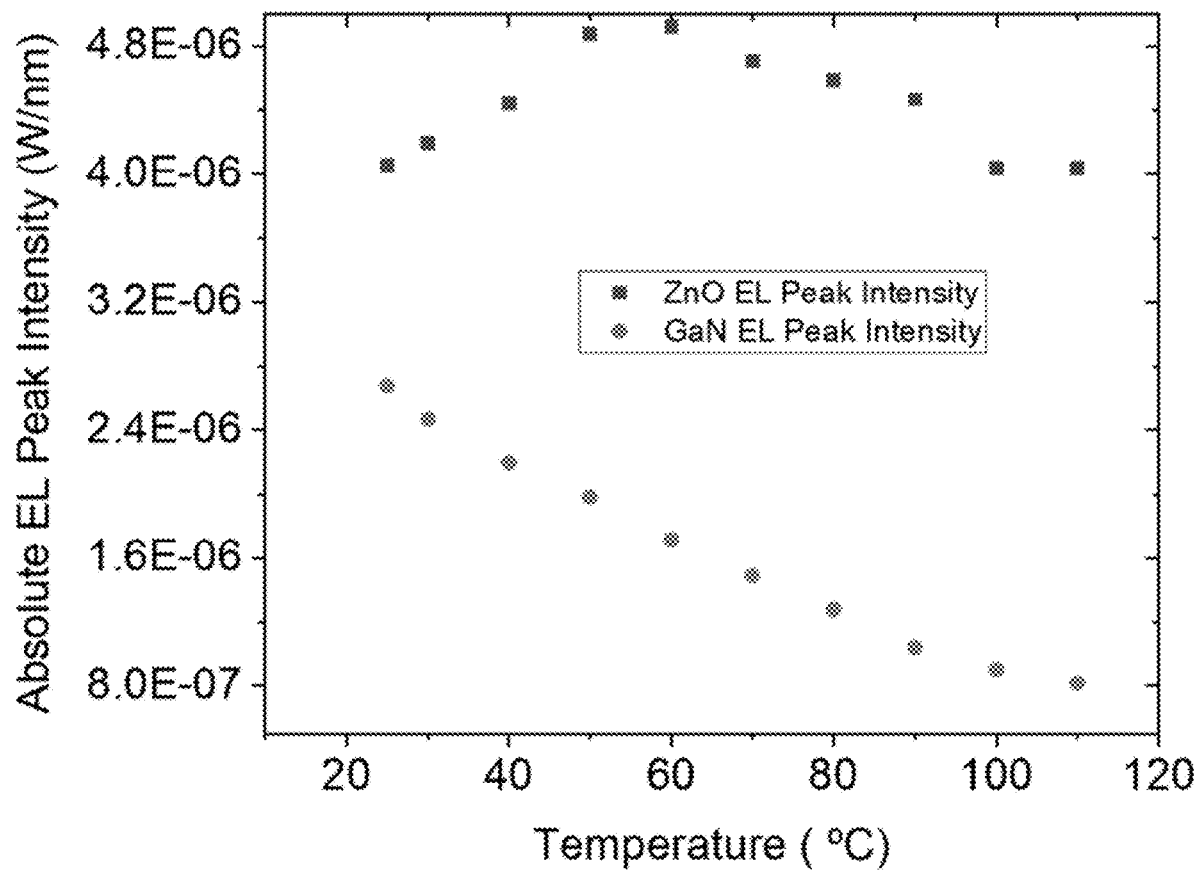
FIG. 21 shows pixel containing 3 light articles as fin LEDs driven at 2 mA of DC current, wherein impact of temperature on intensity of EL peak for ZnO at 386 nm (dark points) and GaN peak at 420 nm. As temperature changed from 25° C. to 110° C., for ZnO, emission intensity first showed an increase, then reached a terminal value that matched its initial value, and for the GaN peak, emission intensity decreased as temperature increased.

In FIG. 18c, we see that as current is raised, the EL UV peaks redshift, approximately, in a linear fashion. For instance, the 368.4 nm peak redshifts approx. 3 nm (27 meV) at 10 mA, and 17 nm (144 meV) at 100 mA, reaching 385.4 nm. This shift is attributed to the junction temperature, as the temperature-dependent EL studies of the fin LEDs also show a linear redshift in the UV peak position (supplementary materials, FIG. 20). Based on these measurements, the 17 nm redshift in the fin LED corresponds to a drastic rise in the junction temperature of about 340° C. during its 0.5 s operation. Also, at low injection current of 2 mA, the temperature-dependent EL analysis from 25° C. to 110° C. (FIG. 18d) shows no significant variation in the charge recombination in the ZnO fin. This could be attributed to the minor contribution of defect-related Shockley-Read-Hall (SRH) non-radiative carrier recombination in the fin. Meanwhile, a gradual suppression of e-h recombination in GaN is observed as temperature is raised (supplementary materials, FIG. 21). These results underline the tolerance of fin LEDs to non-radiative recombination processes both at low and high current densities. The resilience of fin LEDs to high temperature is also in line with a higher exciton binding energy of ZnO compared to GaN. It should be noted that the typical commercial LEDs are limited to an upper operating temperature of ≈150° C.

These fin LEDs can sustain unprecedented current densities; for instance, on the order of 1 MA/cm$^2$ for a fin LED pixel that contains three nanofins, each with a metal-semiconductor area of 6.7×10$^{-8}$ cm$^2$ (2.8 μm×0.8 μm). To put this in perspective, typical planar LEDs are already in their efficiency-droop regime at 100 A/cm$^2$ drive current. The highest reported current density values for nanowire-based LEDs fall in the range of 7 kA/cm$^2$ to 20 kA/cm$^2$, where the efficiency droop overwhelms the overall device efficiency.

The total radiant flux (output optical power) at 100 mA reaches 1 μW (±10%) for the fin LED as shown in FIG. 17c. This translates to an output power density of 45 W/cm$^2$ based on a p-n junction area of ≈2.4×10$^{-8}$ cm$^2$. This power density is on par with the output power of the brightest commercial planar UV-A LEDs of ≈50 W/cm$^2$. The nanowire LEDs have so far shown output powers that are an order of magnitude smaller than those for the planar LEDs. Recent measurements using ensembles of free-standing nanowire LEDs show power density values in the range of 0.001 W/cm$^2$, 0.5 W/cm$^2$, and 3 W/cm$^2$, respectively, for axial InGaN/GaN nanowires, InGaN/AlGaN dot-in-a-wire core-shell nanowires, and core-shell AlInGaN nanowires. Full three-dimensional Finite-Difference Time-Domain (FDTD) modeling (FIG. 18e) shows that the fin LEDs have an intrinsic light extraction efficiency (LEE) of about 15%. The rest of the light is trapped in the p-GaN substrate, due to a higher refractive index of GaN (2.5) relative to ZnO (2.2). LEE could be increased to more than 80% by improving the chip design with the commensurate expected increase of the measured output power of 45 W/cm$^2$ by a factor of 5. By increasing the IQE of a fin LED from its current value of about 35% to 90% (which is the IQE of current GaN LEDs) and an increase in the fin LED drive current from 100 mA to 1000 mA, it is estimated that the output power can be increased by a factor of 100 relative to existing planar LEDs.

Figure 19:
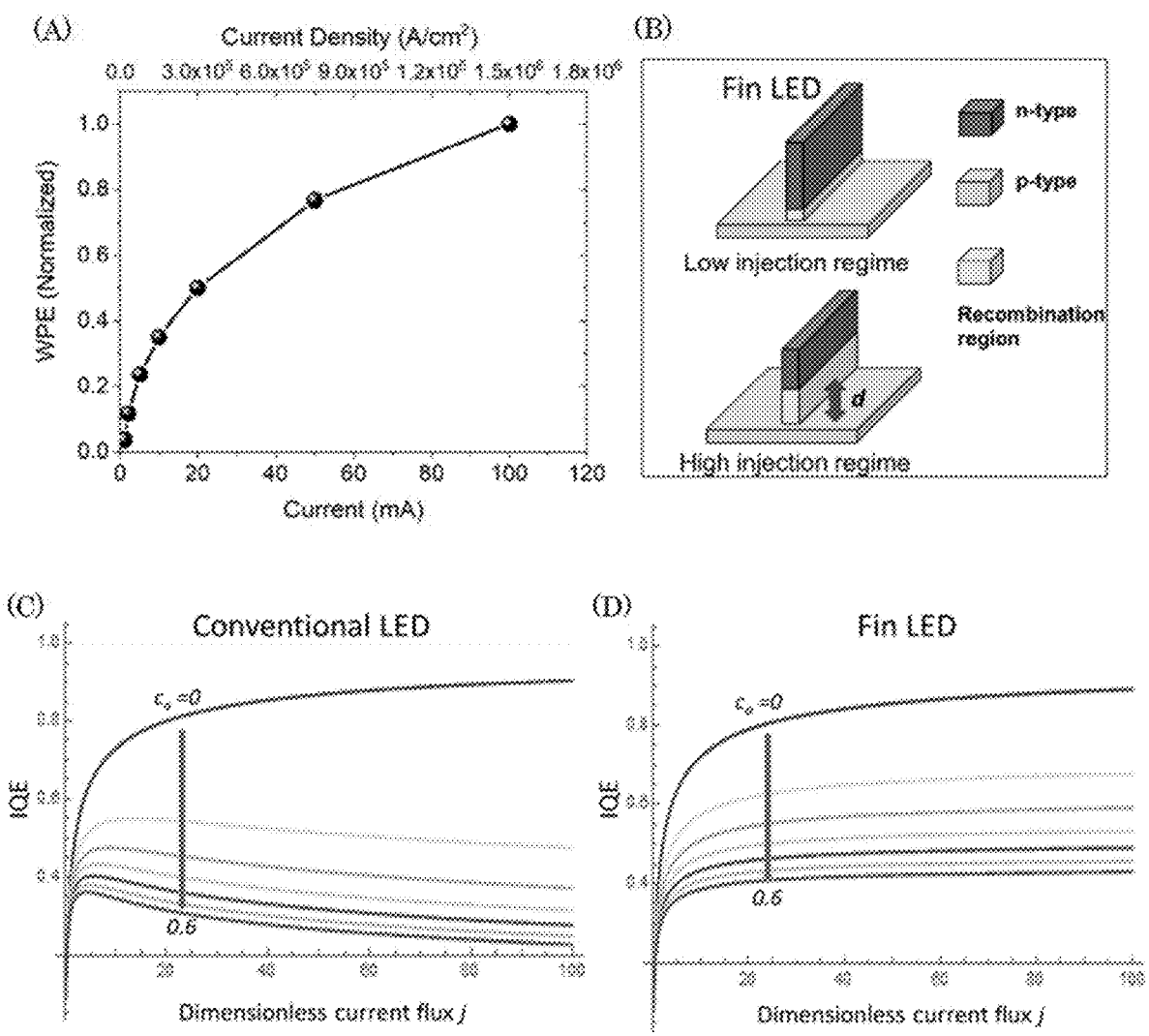
FIG. 19 shows efficiency of light article as fin LEDs at high current density, wherein panel A shows a normalized wall-plug efficiency of a fin LED from 1 mA to 100 mA; panel B shows fin LED charge spreading length "d" at low and high current injection regimes; panel C shows calculated IQE versus dimensionless current flux j for conventional LEDs, wherein dimensionless Auger recombination constant $c_a$ varies from 0 to 0.6; panel D shows calculated IQE versus dimensionless current flux j for fin LED, wherein dimensionless Auger recombination constant $c_a$ varies from 0 to 0.6, and a parameter used in the calculation is dimensionless injection current flux $j_o$=5.

FIG. 19a shows the normalized wall-plug efficiency (WPE), ratio of output power to input electrical power, of a fin LED. There is no sign of decline in the performance of the fin LEDs at high current densities. This is remarkable; normally LEDs show a strong drop in efficiency as current density increases, long before reaching such high densities. The IQE of the ZnO—GaN heterojunction is a determining parameter in the overall performance of the LED. We attribute the IQE improvement to two factors: (a) the fin shape forming a heterodimensional contact with GaN facilitating the current gradient saturation and (b) the high quality of ZnO crystal evidenced by the narrow bandwidth transitions observed by the CL and EL spectroscopy. To support this interpretation, we present a three-parameter model based on the radiative and nonradiative processes (ABC) including the SRH and Auger recombination in which the energy is eventually released as heat. According to the ABC model (supplementary materials, Eq. 1), the IQE is given by:

$$\eta = \frac{N_p}{1 + N_p + c_a N_p^2} \qquad (1)$$

Here $N_p = n/n_o$, is the dimensions electron-hole pair density, $$n_o = \frac{A}{B},$$

Figure 22:
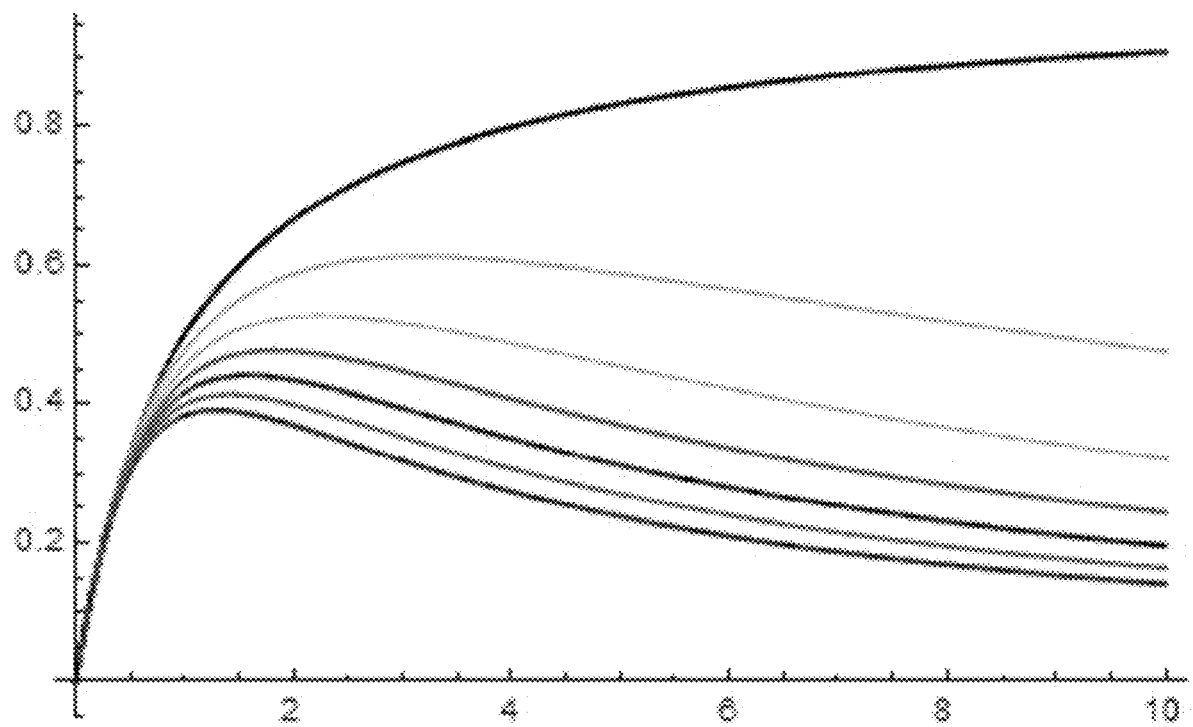
FIG. 22 shows a graph of IQE versus $n/n_o$ for $c_a$ from 0 to 0.6 for a light article.
Figure 23:
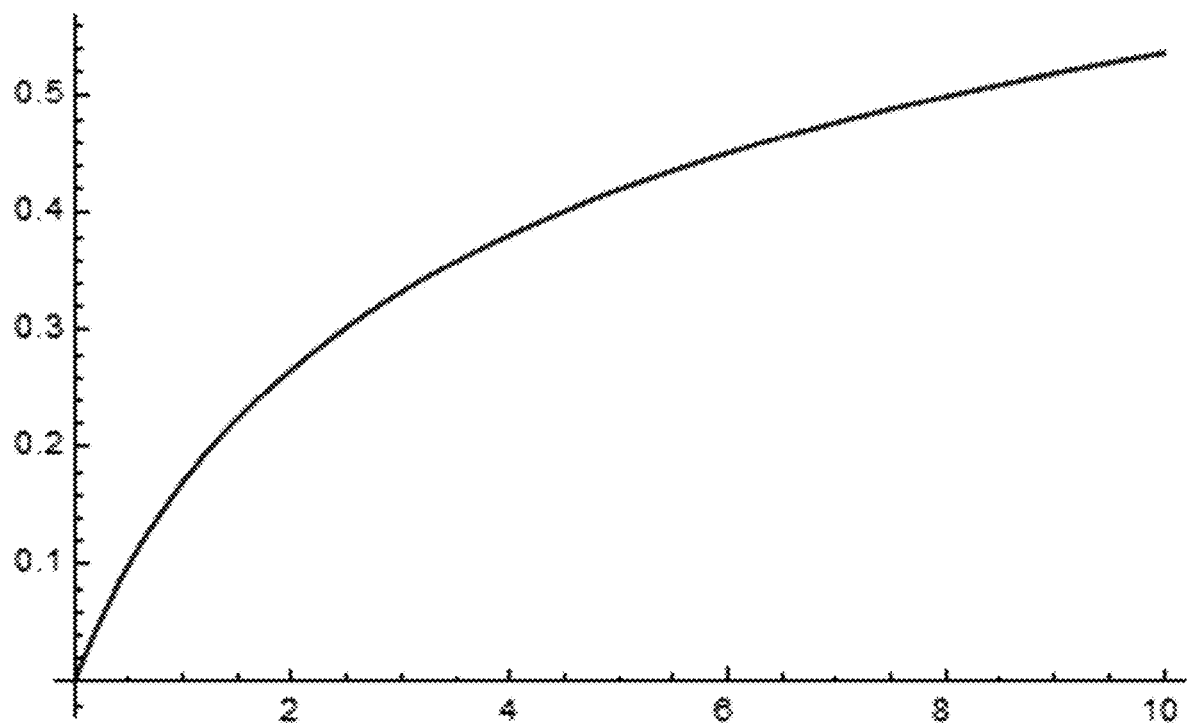
FIG. 23 shows a graph of IQE versus j for a low injection case for a light article.
Figure 24:
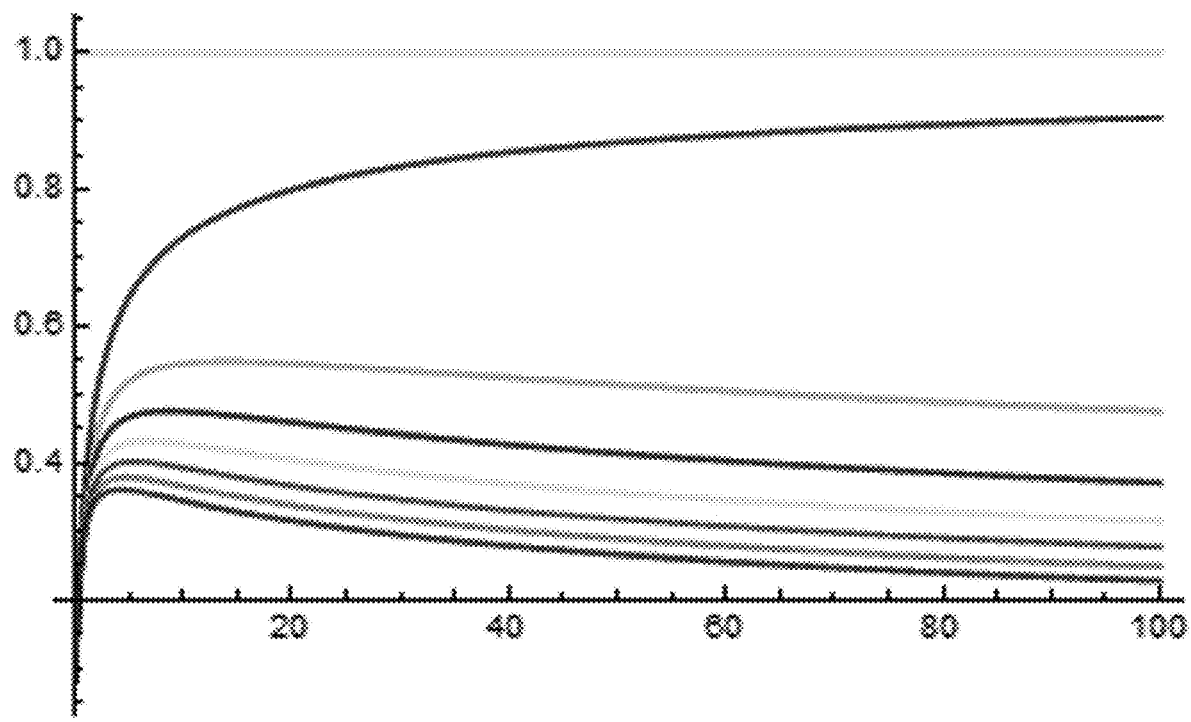
FIG. 24 shows a graph of IQE vs. dimensionless current flux j for conventional LEDs, wherein dimensionless Auger recombination constant $c_a$ varied from 0 to 0.6 at a step increment of 0.1.
Figure 25:
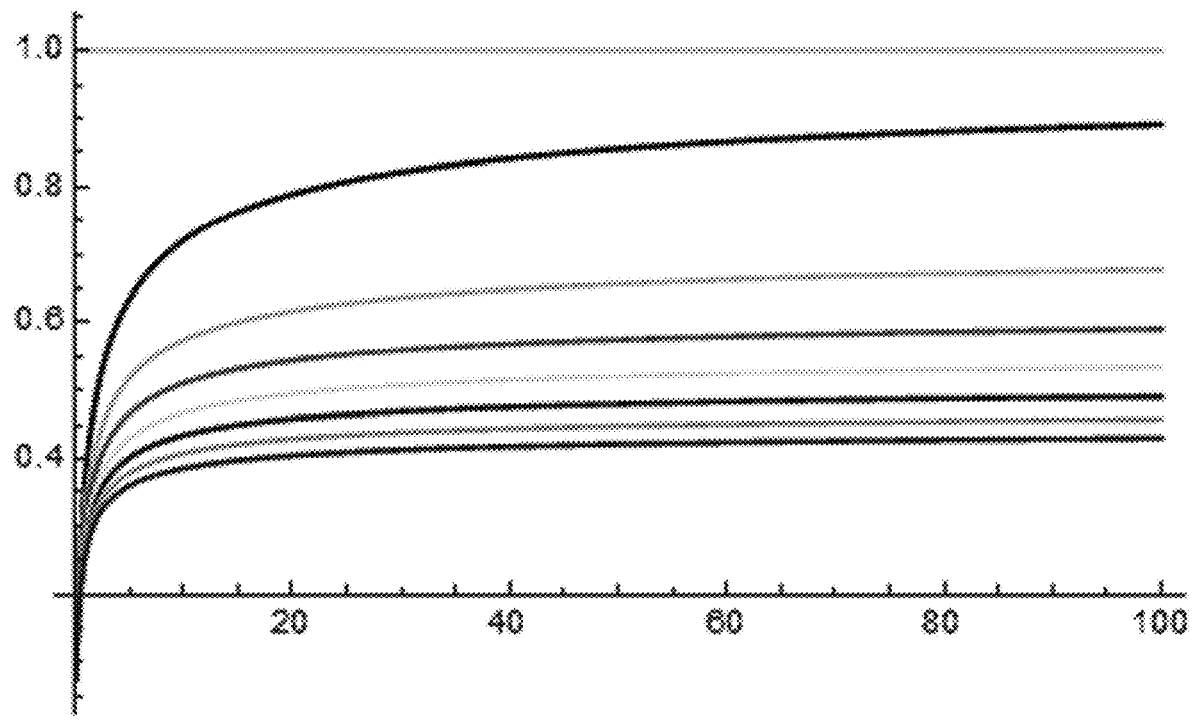
FIG. 25 shows a graph of IQE vs. dimensionless current flux j for a light article as a fin LED, wherein dimensionless Auger recombination constant $c_a$ varied from 0 to 0.6 at a step increment of 0.1, and a parameter used in the calculation was dimensionless injection current flux $j_o=5$.

$c_a = CA/B^2$, and $c_a$ is the dimensionless Auger recombination constant. This model (FIG. 22) describes the impact of rise of non-radiative Auger recombination and decline of IQE. In the steady state, the current density flux gradient is estimated as J=I/(qd), where J=An+Bn$^2$+Cn$^3$. Here I is the current density, y is the electron charge, and d is the characteristic length of the recombination region. The current density flux gradient (J) could be rewritten as $j = N_p + N_p^2 + c_a N_p^3$. Here, the dimensionless current flux density is $j = J/(An_o)$.

We consider two limiting cases: (1) The low injection regime when the generation occurs close to the heterointerface. In this case, the Auger recombination is negligible. (2) High injection regime, when the generation occurs in the fin and the Auger recombination is dominant. In the low injection case, we neglect the Auger recombination contribution in the current flux density. In this case, the SRH defect-related carrier recombination is more dominant, however, it does not cause the efficiency droop. In the high injection regime, the Auger recombination is dominant, and the equation for the current flux density becomes $j = N_p + N_p^2 + c_a N_p^3 \approx c_a N_p^4$. At this regime, $$\eta_{high} = \frac{1}{c_a^{2/3} j^{1/3}} \qquad (2)$$

This equation applies when $c_a N_p \gg 1$ or $(jc_a^2)^{1/3} \gg 1$. The general expression for IQE could be interpolated as $$\eta = \frac{1}{1/\eta_{high} + 1/\eta_{low}} \qquad (3)$$

A difference between conventional LED and fin LED is dependence of current gradient j on the injection level. For conventional LEDs, the length of the recombination region, d, is nearly independent of injected current, I. For the fin LEDs (FIG. 19b), d increases with I and the current gradient j saturates leading to the saturation of the Auger recombination. For the conventional LED, we obtain the dependencies shown in FIG. 19c. In this graph, as the Auger recombination constant $c_a$ increases, the IQE declines (top to bottom). For the case of the fin LED, we assume that at high injections the electron hole pairs spread out, i.e., d increases (FIG. 19b) and the electron-hole flux gradient $j_{fin}$ saturates at a certain value of $j_a$. Therefore, for the high injection regime of a fin LED $$\eta_{highfin} = \frac{1}{c_a^{2/3} j_o^{1/3}} \qquad (4)$$

Then using the interpolation $$\eta = \frac{1}{1/\eta_{highfin} + 1/\eta_{low}} \qquad (5)$$

we obtain the droop-free dependencies at high injection levels shown in FIG. 19d.

The model highlights the two factors stated above in improving the IQE at high current densities, namely, the fin shape facilitating the current gradient saturation and the high quality of ZnO crystal. In addition, ZnO fins do not host the threading dislocations originated at the underlying GaN substrate. This is due to their growth mechanism that governs the lateral growth in the surface-directed VLS process versus the epitaxy used in growth of conventional LEDs. Previously ZnO—GaN thin film-based LEDs have shown the efficiency droop effect. Hence, ZnO is most likely not the critical compound for creating a droop-free LED. A ZnO fin, however, due to its sub-200 nm width is expected to have a lower potential drop and resistive loss across its width, two factors that are known to impact the IQE. The comb like structure of the p-GaN contact is also effective for current spreading layer and effective hole injection into the fins. The linear rise of output power versus injected current at high current density (FIG. 17c) shows the effectiveness of the fins in charge injection. Furthermore, the minimal impact of temperature on the defect-related SRH carrier loss in ZnO fin, at low injection current (FIG. 18d) is consistent with the low defect density of the fins. There is no electron blocking layer in the presented fin heterojunction. Nevertheless, there is no electron leakage and charge recombination in the p-GaN at high current densities. Hence, our results suggest the absence or negligible presence of the critical factors that reduce the efficiency of conventional LEDs including electron leakage, Auger recombination, defect-related recombination and temperature degradation.

While one or more embodiments have been shown and described, modifications and substitutions may be made thereto without departing from the spirit and scope of the invention. Accordingly, it is to be understood that the present invention has been described by way of illustrations and not limitation. Embodiments herein can be used independently or can be combined.

All ranges disclosed herein are inclusive of the endpoints, and the endpoints are independently combinable with each other. The ranges are continuous and thus contain every value and subset thereof in the range. Unless otherwise stated or contextually inapplicable, all percentages, when expressing a quantity, are weight percentages. The suffix "(s)" as used herein is intended to include both the singular and the plural of the term that it modifies, thereby including at least one of that term (e.g., the colorant(s) includes at least one colorants). "Optional" or "optionally" means that the subsequently described event or circumstance can or cannot occur, and that the description includes instances where the event occurs and instances where it does not. As used herein, "combination" is inclusive of blends, mixtures, alloys, reaction products, and the like.

As used herein, "a combination thereof" refers to a combination comprising at least one of the named constituents, components, compounds, or elements, optionally together with one or more of the same class of constituents, components, compounds, or elements.

All references are incorporated herein by reference.

The use of the terms "a" and "an" and "the" and similar referents in the context of describing the invention (especially in the context of the following claims) are to be construed to cover both the singular and the plural, unless otherwise indicated herein or clearly contradicted by context. "Or" means "and/or." It should further be noted that the terms "first," "second," "primary," "secondary," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity). The conjunction "or" is used to link objects of a list or alternatives and is not disjunctive; rather the elements can be used separately or can be combined together under appropriate circumstances.

What is claimed is:

1. A light article comprising:
a substrate;
a truncated cuboidal fin disposed on the substrate and comprising:
a laterally-grown nanocrystal comprising a longitudinal length and a lateral length that are different;
a charge injection facet arranged along a longitudinal fin axis of the truncated cuboidal fin; and
a truncation facet disposed opposing the charge injection facet and arranged parallel to the longitudinal fin axis;
a side-injector disposed on the charge injection facet of the truncated cuboidal fin and that provides electrons to an active layer; and
the active layer interposed between the side-injector and the substrate and that:
receives electrons from the side-injector;
receives holes from the substrate; and
produces light in response to combining the electrons and the holes.

2. The light article of claim 1, wherein the truncated cuboidal fin further comprises an initiation facet disposed along a lateral fin axis of the truncated cuboidal fin and from which the charge injection facet and the truncation facet propagate during growth.

3. The light article of claim 2, wherein the truncated cuboidal fin further comprises a terminal facet disposed parallel to the lateral fin axis of the truncated cuboidal fin and at which the charge injection facet and the truncation facet terminate along the longitudinal fin axis during growth.

4. The light article of claim 3, wherein the truncated cuboidal fin further comprises a top facet disposed parallel to the longitudinal fin axis of the truncated cuboidal fin and at which the charge injection facet and the truncation facet terminate along a height fin axis of the truncated cuboidal fin during growth.

5. The light article of claim 1, wherein the active layer is interposed between the truncated cuboidal fin and the substrate.

6. The light article of claim 1, wherein the active layer is interposed between the truncated cuboidal fin and the side-injector.

7. The light article of claim 1, further comprising an electrical via disposed on the side-injector.

8. The light article of claim 1, further comprising an electrical via disposed on the substrate.

9. The light article of claim 1, further comprising:
a side-injection drain electrode disposed on the side-injector;
a side-injection source electrode disposed on the side-injector and in electrical communication with the side-injection drain electrode through the side-injector;
a dielectric member disposed on the side-injector between the side-injection drain electrode and the side-injection source electrode; and
a gate electrode disposed on the dielectric member such that:
the gate electrode is in electrical communication with the side-injection drain electrode and the side-injection source electrode through the dielectric member; and
the dielectric member is interposed between the gate electrode and the side-injector;
wherein the side-injector comprises a semiconducting material.

10. The light article of claim 1, wherein the substrate comprises gallium nitride.

11. The light article of claim 1, wherein the active layer comprises a quantum well.

12. The light article of claim 1, wherein the active layer comprises a plurality of quantum dots.

13. The light article of claim 1, wherein the laterally-grown nanocrystal comprises a gallium nitride single crystal; and
the longitudinal fin axis of the truncated cuboidal fin is disposed along a [−1100] index of the substrate.

14. The light article of claim 1, wherein the truncated cuboidal fin comprises zinc oxide.

15. The light article of claim 1, wherein the side-injector comprises an electrical conductor.

16. The light article of claim 1, wherein the side-injector comprises an electrical semiconductor.

17. A light article comprising:
a substrate;
a truncated cuboidal fin disposed on the substrate and comprising:
　a laterally-grown nanocrystal comprising a longitudinal length and a lateral length that are different;
　a charge injection facet arranged along a longitudinal fin axis of the truncated cuboidal fin; and
　a truncation facet disposed opposing the charge injection facet and arranged parallel to the longitudinal fin axis;
a side-injector disposed on the charge injection facet of the truncated cuboidal fin;
an active layer interposed between the side-injector and the substrate;
a side-injection drain electrode disposed on the side-injector;
a side-injection source electrode disposed on the side-injector and in electrical communication with the side-injection drain electrode through the side-injector;
a dielectric member disposed on the side-injector between the side-injection drain electrode and the side-injection source electrode; and
a gate electrode disposed on the dielectric member such that:
　the gate electrode is in electrical communication with the side-injection drain electrode and the side-injection source electrode through the dielectric member; and
　the dielectric member is interposed between the gate electrode and the side-injector;
wherein the side-injector comprises a semiconducting material.

18. A process for producing light with the light article of claim 1, the process comprising:
providing electrons to side-injector, side-injector disposed on charge injection facet opposing truncation facet of truncated cuboidal fin;
communicating electrons from side-injector to active layer;
providing holes to substrate;
communicating holes from substrate to active layer;
receiving, by active layer, electrons from side-injector and holes from substrate;
combining, in active layer, electrons and holes; and
producing light from combining electrons and holes in active layer.

* * * * *